(12) United States Patent
Pratt et al.

(10) Patent No.: US 11,218,118 B2
(45) Date of Patent: Jan. 4, 2022

(54) LINEARITY OPTIMIZER FOR A MILLIMETER-WAVE BEAMFORMING SYSTEM

(71) Applicant: Analog Devices International Unlimited Company, Limerick (IE)

(72) Inventors: Patrick Pratt, Mallow (IE); Hossein Yektaii, Ottawa (CA)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/834,228

(22) Filed: Mar. 30, 2020

(65) Prior Publication Data

US 2021/0305945 A1   Sep. 30, 2021

(51) Int. Cl.
*H03F 1/32* (2006.01)
*H03F 3/24* (2006.01)
(Continued)

(52) U.S. Cl.
CPC ............ *H03F 1/3247* (2013.01); *H03F 3/19* (2013.01); *H03F 3/24* (2013.01); *H04B 1/0475* (2013.01);
(Continued)

(58) Field of Classification Search
CPC . H03F 1/3247; H03F 3/19; H03F 3/24; H03F 2200/451; H04B 1/0475; H04B 2001/0425
See application file for complete search history.

(56) References Cited

U.S. PATENT DOCUMENTS 7,362,170 B2   4/2008 Louis
7,421,254 B2   9/2008 Behzad
(Continued)

FOREIGN PATENT DOCUMENTS

WO   2011/112129 A1   9/2011

OTHER PUBLICATIONS

Jung et al., Design Optimization and DPD Linearization of GaN-Based Unsymmetrical Doherty Power Amplifiers for 3G Multicarrier Applications, IEEE Transactions on Microwave Theory and Techniques, vol. 57, No. 9, Sep. 2009, 10 pages.
(Continued)

*Primary Examiner* — Jean B Corrielus
(74) *Attorney, Agent, or Firm* — Patent Capital Group

(57) ABSTRACT

An example apparatus includes a power amplifier (PA) and a linearity optimizer. The optimizer includes a PA actuator and a linearity adaptation circuit. The actuator is configured to generate an actuator output based on an actuator input and a vector of complex gains computed by the linearity adaptation circuit based on a feedback signal indicative of PA's output. The adaptation circuit is configured to compute the vector of complex gains in a manner that maximizes the power of the actuator output while ensuring that the deviation of PA's behavior from a linear behavior (e.g., in terms of one or more linearity parameters) is below a threshold. Controlling actuator output in a manner that maximizes its power while taking into consideration one or more linearity parameters to ensure that target linearity is achieved controls drive signals for the PA and, thus, may help in terms of PA linearity and efficiency.

19 Claims, 13 Drawing Sheets

(51) Int. Cl.
*H03F 3/19* (2006.01)
*H04B 1/04* (2006.01)
(52) U.S. Cl.
CPC .................. *H03F 2200/451* (2013.01); *H04B 2001/0425* (2013.01)

(56) References Cited

U.S. PATENT DOCUMENTS

| | | |
|---|---|---|
| 8,013,676 B2 | 9/2011 | Su et al. |
| 8,432,224 B1 | 4/2013 | Woo et al. |
| 8,848,824 B2 | 9/2014 | Teetzel |
| 9,385,666 B2 | 7/2016 | Tam et al. |
| 9,405,332 B2 | 8/2016 | Ichitsubo et al. |
| 10,063,191 B2 | 8/2018 | Sengupta et al. |
| 10,153,735 B2 | 12/2018 | Tucker |
| 2010/0148862 A1* | 6/2010 | Woo ...................... H03F 1/0288 330/124 R |
| 2011/0227770 A1* | 9/2011 | Kaper ................. H03M 1/1052 341/120 |
| 2012/0169424 A1* | 7/2012 | Pinarello ............... H03F 1/3247 330/285 |
| 2013/0072129 A1* | 3/2013 | Donovan .............. H03F 1/0216 455/67.11 |
| 2013/0257529 A1* | 10/2013 | Komninakis ............. H03F 3/24 330/149 |
| 2015/0031318 A1* | 1/2015 | McCallister .......... H03F 1/0222 455/114.3 |
| 2015/0071382 A1* | 3/2015 | Wu ....................... H03F 1/0238 375/297 |
| 2015/0162882 A1* | 6/2015 | Tam ...................... H03F 1/3282 330/291 |
| 2018/0124716 A1* | 5/2018 | Krishnan ................. H03F 3/19 |
| 2020/0212975 A1* | 7/2020 | Jelonnek .............. H04B 1/0475 |

OTHER PUBLICATIONS

Sajedin et al., A Survey on RF and Microwave Doherty Power Amplifier for Mobile Handset Applications, Electronics 2019, www.mdpi.com/journal/electronics, 31 pages.

Maudoux, Optimizing Your Power Amplifier for Predistortion with RF PA Linearization (RFPAL), https://www.maximintegrated.com/en/design/technical-documents/app-notes/6/6323.html, Mar. 27, 2020, 19 pages.

\* cited by examiner

LINEARITY OPTIMIZER FOR A MILLIMETER-WAVE BEAMFORMING SYSTEM

TECHNICAL FIELD OF THE DISCLOSURE

The present disclosure generally relates to electronics, and, more specifically, to radio frequency (RF) transceivers.

BACKGROUND

Radio systems are systems that transmit and receive signals in the form of electromagnetic waves in the RF range of approximately 3 kilohertz (kHz) to 300 gigahertz (GHz). Radio systems are commonly used for wireless communications, with cellular/wireless mobile technology being a prominent example, but may also be used for cable communications such as cable television. In both of these types of systems, linearity of various components therein plays a crucial role.

Linearity of an RF component or a system is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency and/or output power.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
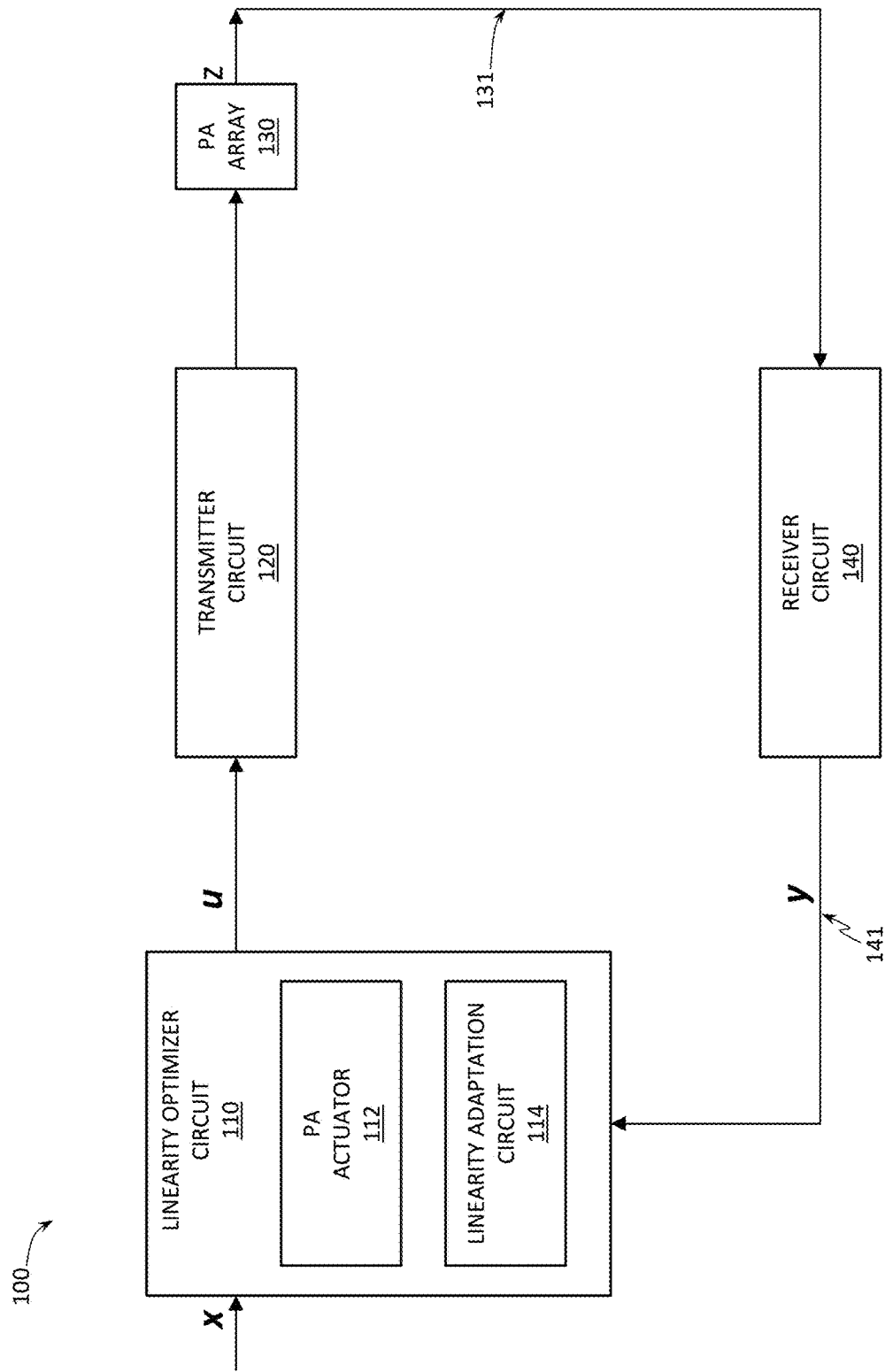
FIG. 1 provides a schematic block diagram of an RF transceiver with a linearity optimizer configured to adjust the drive signal for an amplifier, according to some embodiments of the present disclosure.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating RF transceivers with linearity optimizers proposed herein, it might be useful to first understand phenomena that may come into play in RF communication systems. The following foundational information may be viewed as a basis from which the present disclosure may be properly explained. Such information is offered for purposes of explanation only and, accordingly, should not be construed in any way to limit the broad scope of the present disclosure and its potential applications.

In context of wireless radio systems, antenna is a device that serves as an interface between radio waves propagating wirelessly through space and electric currents moving in metal conductors used in a transmitter or a receiver. During transmission, a transmitter circuit of an RF transceiver may supply an electric signal, which signal is amplified by a power amplifier, and an amplified version of the signal is provided to antenna's terminals. The antenna may then radiate the energy from the signal output by the power amplifier as radio waves. Similarly, in cable radio systems, an electric signal is first amplified by a power amplifier, prior to transmission over a wired cable connection. Therefore, linear and efficient power amplifiers are essential both for wireless and for cable communication systems.

Made from semiconductor materials, which are inherently nonlinear, and having to operate at relatively high power levels, power amplifiers are usually the first components to analyze when considering a design of an RF system in terms of linearity. Power amplifier outputs with nonlinear distortions can result in reduced modulation accuracy (e.g., reduced error vector magnitude (EVM)) and/or out-of-band emissions. Therefore, both wireless communication systems (e.g., Long Term Evolution (LTE) and millimeter-wave or $5^{th}$ generation (5G) systems) and cable communication systems have stringent specifications on power amplifier linearity.

While linearity is also important for small-signal amplifiers such as low-noise amplifiers, the challenges of linearity are particularly pronounced for power amplifiers because such amplifiers are typically required to produce relatively high levels of the output power and are, therefore, particularly susceptible to entering certain operating conditions where nonlinear behavior can no longer be ignored. On one hand, the nonlinear behavior of semiconductor materials used to form amplifiers tends to worsen when the amplifiers operate on signals with high power levels (an operating condition commonly referred to as "operating in saturation"), increasing the amount of nonlinear distortions in their output signals, which is highly undesirable. On the other hand, amplifiers operating at relatively high power levels (i.e., operating in saturation) also typically function at their highest efficiency, which is highly desirable. As a result, linearity and efficiency (or power level) are two performance parameters for which, often, an acceptable trade-off has to be found in that an improvement in terms of one of these parameters comes at the expense of the other parameter being suboptimal. To that end, the term "back-off" is used in the art to describe a measure of how far the input power (i.e., the power of a signal provided to the amplifier to be amplified) should be reduced in order to realize the desired output linearity (e.g., back-off may be measured as a ratio between the input power that delivers maximum power to the input power that delivers the desired linearity). Thus, reducing the input power may provide an improvement in terms of linearity but results in a decreased efficiency of the amplifier.

In conventional RF transceivers, back-off is implemented using a closed loop gain control where a gain, applied to an input signal for a power amplifier, is adjusted to regulate the power of the amplifier output. In such implementations, a power detector is used to sense the power of the amplifier output, which power is then adjusted to achieve the desired back-off that is expected to yield linear operation.

Inventors of the present disclosure realized that conventional RF transceivers with closed loop gain control have drawbacks that may render them sub-optimal for the latest communication technologies such as millimeter-wave/5G technologies. For example, inventors realized that regulating the gain of an input signal provided to a power amplifier based on the output power only may result in situations where the power of the input to the power amplifier (and, therefore, the power of the output of the power amplifier) is decreased (i.e., back-off is present) even though the output of the power amplifier would have been sufficiently linear even without such a decrease. The opposite situations may also occur, where the power of the input to the power amplifier is not decreased even though the output of the power amplifier is not sufficiently linear.

Various embodiments of the present disclosure provide systems and methods that aim to improve on one or more of the drawbacks described above in providing linear and efficient amplifiers (such as, but not limited to, power amplifiers, low-noise amplifiers, or variable gain amplifiers) for RF systems (such as, but not limited to, beamforming antenna array systems of millimeter-wave/5G technologies).

In one aspect of the present disclosure, an example apparatus, e.g., an example RF transceiver for a millimeter-wave beamforming communication system, includes a power amplifier array and a linearity optimizer circuit (referred to herein as a "linearity optimizer"). The power amplifier array includes at least one, but typically a plurality, of power amplifiers. The linearity optimizer includes a power amplifier actuator (i.e., an actuator for the power amplifier array) and a linearity adaptation circuit. The actuator is configured to generate an actuator output (u) based on an actuator input (x) and a vector of complex gains computed by the linearity adaptation circuit based on a feedback signal (y) indicative of the output of the power amplifier array. The linearity adaptation circuit is configured to compute the vector of complex gains in a manner that maximizes the power of the actuator output while ensuring that the deviation of the behavior of the power amplifier array from a linear behavior (measured, e.g., in terms of an error $\varepsilon$ for one or more linearity parameters) is below a threshold ($\varepsilon_{min}$). The output of the power amplifier array is based on the actuator output. In this aspect of the disclosure, the drive signal for the power amplifier array is based on the actuator output. Therefore, controlling the actuator output in a manner that maximizes its power while computing and taking into consideration one or more linearity parameters to ensure that target linearity is achieved controls the drive signal for the power amplifier array and, thus, may help ensuring that the power amplifier array is both linear and efficient (i.e., in which the back-off can be minimized or eliminated), which is essential for modern communication systems.

In another aspect of the present disclosure, an example apparatus is similar to the one described above, except that, instead of modifying the drive signal, the actuator is configured to modify the bias signal for the power amplifier array, which is done based on a control signal generated by the linearity adaptation circuit. Similar to the linearity adaptation circuit computing a vector of complex gains for adjusting a drive signal for the power amplifier array, this time the linearity adaptation circuit is configured to generate a control signal for adjusting the bias signal based on a feedback signal (y) indicative of the output of the power amplifier array in a manner that maximizes the power of the actuator output while ensuring that the deviation of the behavior of the power amplifier array from a linear behavior is below a threshold. The output of the power amplifier array is based on the bias signal used to individually or collectively bias the array of power amplifiers. In this aspect of the disclosure, the bias signal for the power amplifier array is based on the control signal generated by the linearity adaptation circuit. Therefore, generating the control signal in a manner that maximizes its power while computing and taking into consideration one or more linearity parameters to ensure that target linearity is achieved controls the bias signal for the power amplifier array and, thus, may help ensuring that the power amplifier array is both linear and efficient.

In other aspects of the present disclosure, both the drive signal and the bias signal for the power amplifier array may be adjusted as described herein.

While some of the descriptions are provided herein with reference to power amplifiers, in general, various embodiments of linearity optimizers presented herein are applicable to amplifiers other than power amplifiers, such as low-noise amplifiers, variable gain amplifiers, etc., as well as to nonlinear electronic components of RF transceivers (i.e., components that may exhibit nonlinear behavior) other than amplifiers. Furthermore, while some of the descriptions are provided herein with reference to beamforming antenna array systems of millimeter-wave/5G technologies, in general, various embodiments of linearity optimizers presented herein are applicable to any other RF communication systems, or any technology or standard.

As will be appreciated by one skilled in the art, aspects of the present disclosure, in particular aspects of RF transceivers with linearity optimizers for power amplifiers as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." At least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to various devices and systems (e.g. to various components and arrangements of components of RF transceivers, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" may be omitted (e.g., a linearity optimizer circuit 110 shown in the present drawings may be referred to in the present descriptions as a "linearity optimizer 110," etc.). If used, the terms "substantially," "approximately," "about," etc., may be used to generally refer to being within +/−20% of a target value, e.g., within +/−10% of a target value, based on the context of a particular value as described herein or as known in the art.

Example RF Transceiver with a Linearity Optimizer

FIG. 1 provides a schematic block diagram of an RF transceiver 100 with a linearity optimizer configured to adjust the drive signal for an amplifier, according to some embodiments of the present disclosure. As shown in FIG. 1, the RF transceiver 100 may include a linearity optimizer 110, a transmitter circuit 120, a power amplifier array 130, and a receiver circuit 140.

Figure 3:
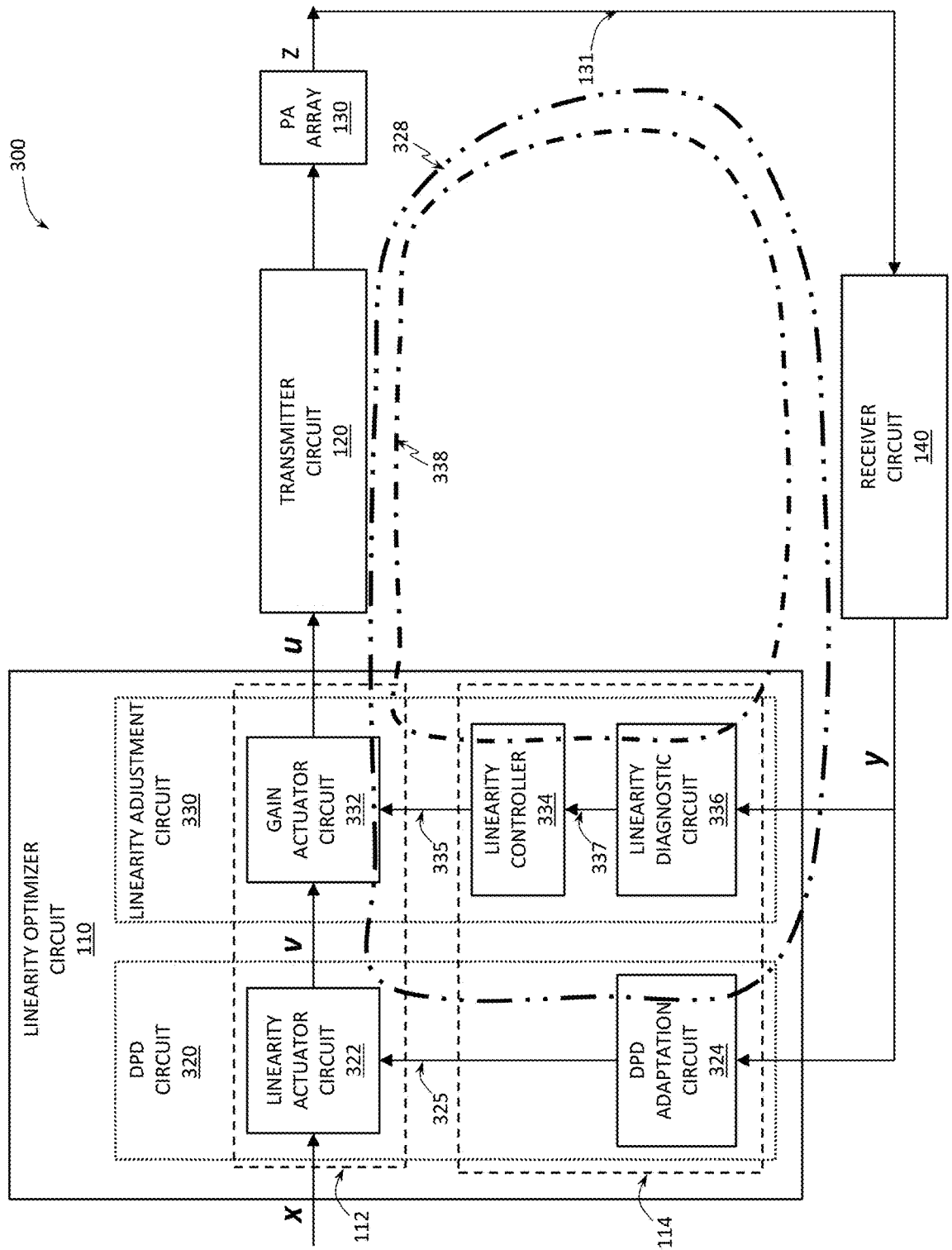
FIG. 3 provides a schematic block diagram an RF transceiver similar to that shown in FIG. 1, further illustrating an example implementation of a linearity optimizer with two loops, according to some embodiments of the present disclosure.

The linearity optimizer 110 is configured to receive an input signal x (which may be a sequence of digital samples and which may be a vector; in general, as used herein, each of the lower case, bold italics single-letter labels used in the present figures, such as x and y, shown in FIG. 1, or x, v, and y, shown in FIG. 3, refers to a vector). In some embodiments, the input signal x may include one or more active channels in the frequency domain, but, for simplicity, an input signal with only one channel (i.e., a single frequency range of in-band frequencies) is described. In some embodiments, the input signal x may be a baseband digital signal. The linearity optimizer 110 is configured to generate an output signal u based on the input signal x, which output signal may then be provided further to the transmitter circuit 120. To that end, the linearity optimizer 110 may include a power amplifier actuator 112 and a linearity adaptation circuit 114. In some embodiments, the actuator 112 may be configured to generate the output signal u based on the input signal x and a vector of complex gains computed by the linearity adaptation circuit 114, as described in greater detail below.

The transmitter circuit 120 may be configured to upconvert the signal u from a baseband signal to a higher frequency signal, such as an RF signal. The RF signal generated by the transmitter 120 may be provided to the power amplifier array 130 which may include one or more power amplifiers. The power amplifier array 130 is configured to amplify the RF signal generated by the transmitter 120 (thus, the power amplifier array 130 is driven by a drive signal that is based on the output of the linearity optimizer 110) and provide an amplified RF signal z (which may be a vector).

The amplified RF signal z can be provided to an antenna (not illustrated in FIG. 1) to be wirelessly transmitted. Ideally, the amplified RF signal z should just be an upconverted and amplified version of the input signal x. However, as discussed above, the amplified RF signal z can have distortions outside of the main signal components. Such distortions can result from nonlinearities in the response of the power amplifier array 130. As discussed above, it can be desirable to reduce such nonlinearities. Accordingly, at least a portion of the output z from the power amplifier array 130 may be provided, as a feedback signal 131, to the receiver circuit 140. The output of the receiver circuit is coupled to the linearity optimizer 110, in particular, to the linearity adaptation circuit 114. In this manner, an output signal y of the receiver circuit 140, which is a signal based on the feedback signal 131 indicative of the output z from the power amplifier array 130, may be provided to the linearity adaptation circuit 114 by way of the receiver circuit 140. Then the linearity adaptation circuit 114 can compute one or more linearity parameters (e.g., an EVM or an adjacent channel leakage ratio (ACLR)) for the feedback signal y and then compute the vector of complex gains in a manner that maximizes the power of the actuator output u while ensuring that the deviation of the behavior of the power amplifier array 130 from a linear behavior (determined based on the one or more computed linearity parameters) is below a certain threshold. Thus, the actuator output u may be adjusted based on the linearity parameters computed by the linearity adaptation circuit 114 for the signal y that is based on the output z of the power amplifier array 130. A signal based on the actuator output u is provided as an input to the power amplifier array 130, meaning that the actuator output u may be used to control the operation of the power amplifier array 130. In particular, using the linearity optimizer 110 to control the actuator output u in a manner that maximizes its power while computing and taking into consideration one or more linearity parameters to ensure that target linearity is achieved may help ensure that operation of the power amplifier array 130 is optimized both in terms of linearity and efficiency/output power (i.e., that the output of the power amplifier array 130 satisfies one or more linearity criteria while minimizing or eliminating the back-off.

Figures 6, 7:
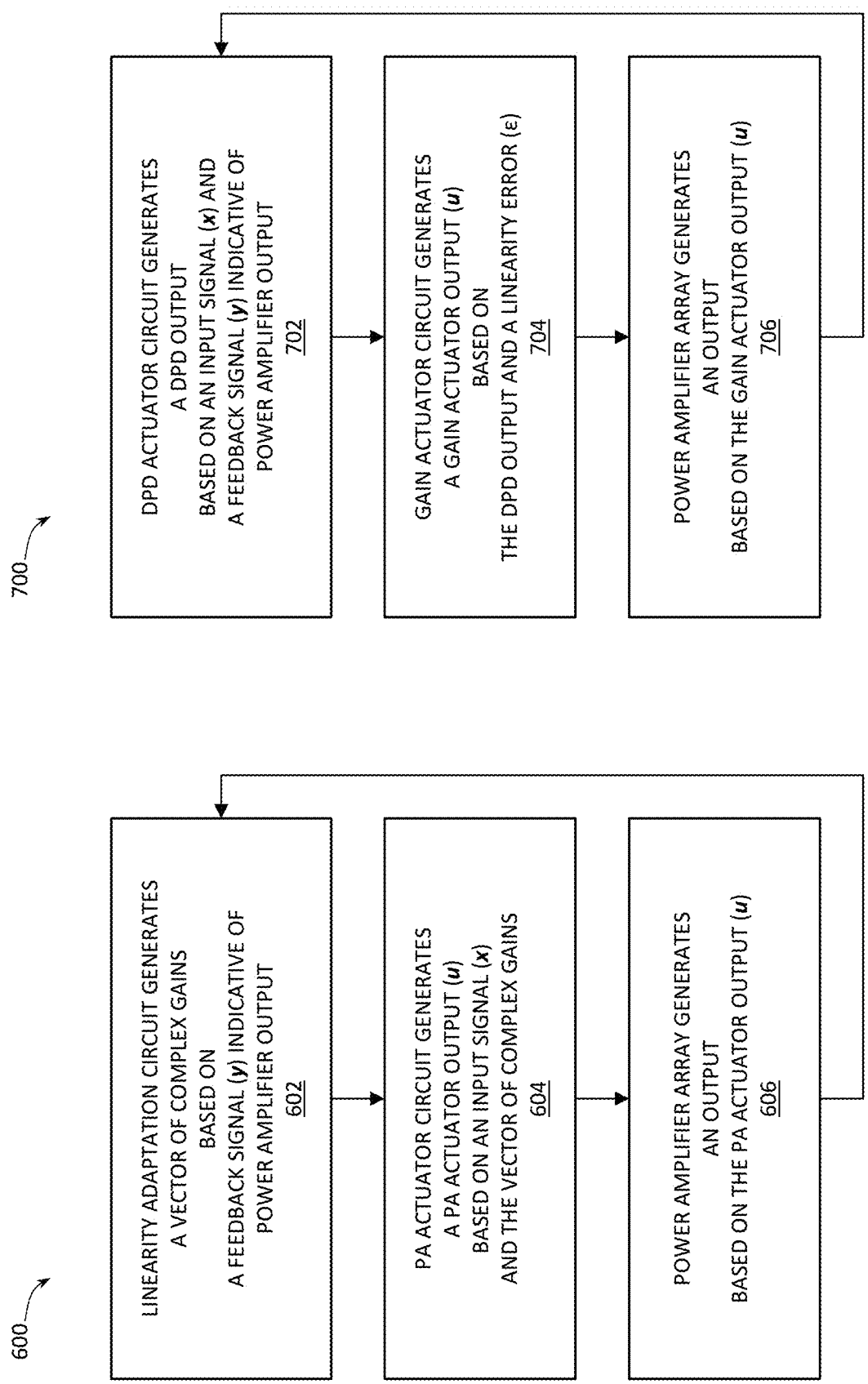
FIG. 6 provides a flow chart of a method for operating an RF transceiver with a linearity optimizer that uses a vector of complex gains, according to some embodiments of the present disclosure.
FIG. 7 provides a flow chart of a method for operating an RF transceiver with a linearity optimizer that employs two loops, according to some embodiments of the present disclosure.

As described above, the linearity adaptation circuit 114 can compute one or more linearity parameters for the feedback signal y and then compute the vector of complex gains in a manner that maximizes the power of the actuator output u while ensuring that the deviation of the behavior of the power amplifier array 130 from a linear behavior (determined based on the one or more computed linearity parameters) is below a certain threshold. In this context, the term "vector" is used to indicate that there may be at least one, but possibly more different gains (or elements of the vector). For example, the power amplifier array 130 may, in general, include N power amplifiers, where N is an integer equal to or greater than 1, and then, correspondingly, the vector of complex gains includes N elements, where each of the N elements is a complex gain for a respective one of the N power amplifiers of the power amplifier array 130. For the embodiments when the power amplifier array 130 includes only one power amplifier, the vector of complex gains is a vector with a single element (i.e., with a single gain). Mathematically, this means that the power amplifier actuator 112 may be parameterised by a vector $\theta \in \mathbb{C}^N$ (i.e., the N-element vector of complex gains) and operates on the input complex baseband signal x to produce a complex baseband output signal u. Such a linearity optimizer 110 may be particular advantageous if combined with a millimetre-wave hybrid array beamforming system (e.g., as illustrated in FIG. 6). The linearity optimizer 110 is configured to find a particular parameterisation (i.e., elements of the vector θ) that maximises the output power (e.g., determined for the output signal $$u \text{ as } \frac{1}{2N} \sum_{m=-N}^{N} |u(n)|^2)$$

while ensuring the deviation from a linear behaviour is below a minimum acceptable level $\varepsilon_{min}$ (e.g., while ensuring that $|x-y|^2 < \varepsilon_{min}$).

Further details of implementing the linearity optimizer 110 are described with reference to FIGS. 3-7. In particular, as will be described with reference to FIGS. 3-7, in some embodiments, the linearity optimizer 110 may be decomposed into (or, phrased differently, may include) two different functions, one being digital predistortion (DPD) and the other one being a gain level adjustment (e.g., root mean square (RMS) gain level adjustment).

In general, the RF transceiver 100 may be any device/apparatus or system configured to support wireless transmission and reception of signals in the form of electromagnetic waves in the RF range of approximately 3 kHz to 300 GHz. In some embodiments, the RF transceiver 100 may be used for wireless communications, e.g., in a base station (BS) or a user equipment (UE) device of any suitable cellular wireless communications technology, such as Global System for Mobile Communication (GSM), Code Division Multiple Access (CDMA), or LTE. In a further example, the RF transceiver 100 may be used as, or in, e.g., a BS or a UE device of a millimeter-wave wireless technology such as 5G wireless (i.e., high frequency/short wavelength spectrum, e.g., with frequencies in the range between about 20 and 60 GHz, corresponding to wavelengths in the range between about 5 and 15 millimeters). In yet another example, the RF transceiver 100 may be used for wireless communications using WiFi technology (e.g., a frequency band of 2.4 GHz, corresponding to a wavelength of about 12 cm, or a frequency band of 5.8 GHz, spectrum, corresponding to a wavelength of about 5 cm), e.g., in a WiFi-enabled device such as a desktop, a laptop, a video game console, a smart phone, a tablet, a smart TV, a digital audio player, a car, a printer, etc. In some implementations, a WiFi-enabled device may, e.g., be a node in a smart system configured to communicate data with other nodes, e.g., a smart sensor. Still in another example, the RF transceiver 100 may be used for wireless communications using Bluetooth technology (e.g., a frequency band from about 2.4 to about 2.485 GHz, corresponding to a wavelength of about 12 cm). In other embodiments, the RF transceiver 100 may be used for transmitting and/or receiving RF signals for purposes other than communication, e.g., in an automotive radar system, or in medical applications such as magneto-resonance imaging (MRI).

Figure 2:
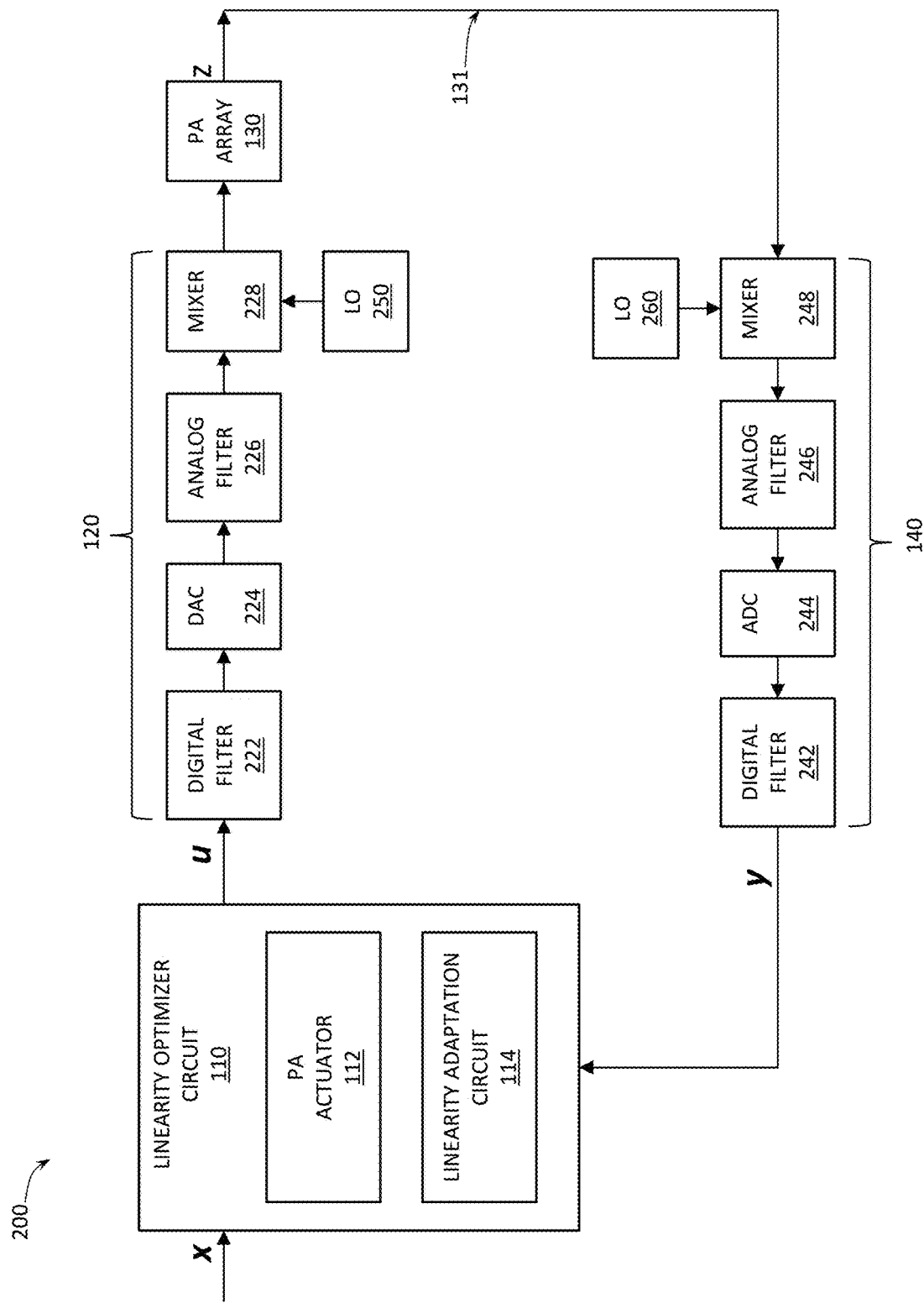
FIG. 2 provides a schematic block diagram of an RF transceiver similar to that shown in FIG. 1, further illustrating example implementations of transmitter and receiver circuits, according to some embodiments of the present disclosure.

FIG. 2 provides a schematic block diagram of an RF transceiver 200 similar to the RF transceiver 100 shown in FIG. 1, further illustrating example implementations of the transmitter circuit 120 and the receiver circuit 140, according to some embodiments of the present disclosure. The RF transceiver 200 shown in FIG. 2 is one example implementation of the RF transceiver 100 shown in FIG. 1, where the same reference numerals as described above refer to the same or analogous elements/components so that descriptions provided with respect to one of these figures are assumed to be applicable and do not have to be repeated for the other, and only the differences are described.

As shown in FIG. 2, in some embodiments, the transmitter 120 may include a digital filter 222, a digital-to-analog converter (DAC) 224, an analog filter 226, and a mixer 228. In such a transmitter, the signal u may be filtered in the digital domain by the digital filter 222 to generate a filtered predistorted input, a digital signal. The output of the digital filter 322 may then be converted to an analog signal by the DAC 224. The analog signal generated by the DAC 224 may then be filtered by the analog filter 226. The output of the analog filter 226 may then be upconverted to RF by the mixer 228, which may receive a signal from a local oscillator 250 to translate the filtered analog signal from the analog filter 226 from baseband to RF. Other methods of implementing the transmitter 120 are also possible and within the scope of the present disclosure. For instance, in another implementation (not illustrated in the present drawings) the output of the digital filter 222 can be directly converted to an RF signal by the DAC 224. In such an implementation, the RF signal provided by the DAC 224 can then be filtered by the analog filter 226. Since the DAC 224 would directly synthesize the RF signal in this implementation, the mixer 228 and the local oscillator 250 illustrated in FIG. 2 can be omitted from the transmitter circuit 120 in such embodiments.

As further shown in FIG. 2, in some embodiments, the receiver 140 may include a digital filter 242, an analog-to-digital converter (ADC) 244, an analog filter 246, and a mixer 248. In such a receiver, the feedback signal 131 may be downconverted to the baseband by the mixer 148, which may receive a signal from a local oscillator 260 (which may be the same or different from the local oscillator 250) to translate the feedback signal 131 from the RF to the baseband. The output of the mixer 248 may then be filtered by the analog filter 246. The output of the analog filter 246 may then be converted to a digital signal by the ADC 244. The digital signal generated by the ADC 224 may then be filtered in the digital domain by the digital filter 242 to generate a filtered downconverted feedback signal y, which may be a sequence of digital values indicative of the output z of the power amplifier array 130, and which may also be modeled as a vector. The feedback signal y may be provided to the linearity optimizer 110. Other methods of implementing the receiver 140 are also possible and within the scope of the present disclosure. For instance, in another implementation (not illustrated in the present drawings) the RF feedback signal 131 can be directly converted to a baseband signal by the ADC 244. In such an implementation, the downconverted signal provided by the ADC 244 can then be filtered by the digital filter 242. Since the ADC 244 would directly synthesize the baseband signal in this implementation, the mixer 248 and the local oscillator 260 illustrated in FIG. 2 can be omitted from the receiver circuit 140 in such embodiments.

Further variations are possible to the RF transceiver 200 described above. For example, while upconversion and downconversion is described with respect to the baseband frequency, in other embodiments of the RF transceiver 200, an intermediate frequency (IF) may be used instead. IF may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the mixers of RF transmitter 120 or the receiver 140 may include several such stages of IF conversion. In another example, although a single path mixer is shown in each of the transmit (TX) path (i.e., the signal path for the signal to be processed by the transmitter 120) and the receive (RX) path (i.e., the signal path for the signal to be processed by the receiver 140) of the RF transceiver 200, in some embodiments, the TX path mixer 228 and the RX path mixer 248 may be implemented as a quadrature upconverter and downconverter, respectively, in which case each of them would include a first mixer and a second mixer. For example, for the RX path mixer 248, the first RX path mixer may be configured for performing downconversion to generate an in-phase (I) downconverted RX signal by mixing the feedback signal 131 and an in-phase component of the local oscillator signal provided by the local oscillator 260. The second RX path mixer may be configured for performing downconversion to generate a quadrature (Q) downconverted RX signal by mixing the feedback signal 131 and a quadrature component of the local oscillator signal provided by the local oscillator 260 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

Example Linearity Optimizers Configured to Adjust Drive Signals to Amplifiers

Turning to the details of the linearity optimizer 110, functionality of performing optimization of the power amplifier array 130 in terms of both linearity and power by adjusting the drive signal to the power amplifier array 130 may be illustrated with reference to FIGS. 3-7.

FIG. 3 provides a schematic block diagram of an RF transceiver 300 similar to the RF transceivers 100 or 200, further illustrating an example implementation of the linearity optimizer 110 with two loops, according to some embodiments of the present disclosure. The RF transceiver 300 shown in FIG. 3 is one example implementation of the RF transceiver 100 shown in FIG. 1, where the same reference numerals as described above refer to the same or analogous elements/components so that descriptions provided with respect to one of these figures are assumed to be applicable and do not have to be repeated for the other, and only the differences are described. In some embodiments of the RF transceiver 300, the transmitter and the receiver circuits 120, 140 may be implemented as described with reference to the RF transceiver 200.

Embodiment shown in FIG. 3 is based on recognition that generation of a vector of complex gains by the linearity optimizer 110 may be enhanced in its ability to improve both the linearity and the efficiency/output power of the power amplifier array 130 by also implementing DPD. In general, DPD involves applying, in the digital domain, predistortion to an input signal to be provided as an input to a power amplifier to reduce and/or cancel distortion that is expected to be caused by the power amplifier. The predistortion can be characterized by a power amplifier model. The power amplifier model can be updated based on the feedback from the power amplifier (i.e., based on the output of the power amplifier). The more accurate a power amplifier model is in terms of predicting the distortions that the power amplifier will introduce, the more effective the predistortion of an input to the power amplifier will be in terms of reducing the effects of the distortion caused by the amplifier.

As shown in FIG. 3, in some embodiments, the linearity optimizer may include a DPD circuit 320 and a linearity adjustment circuit 330, serving different functions. Namely, the DPD circuit 320 is configured to provide the DPD function while the linearity adjustment circuit 330 is configured to provide the gain level adjustment function (e.g., RMS gain level adjustment). In some embodiments, the DPD circuit 320 may be seen as including a linearity actuator circuit 322 and a DPD adaptation circuit 324 (shown in FIG. 3 by being enclosed within a dotted contour of the DPD circuit 320), while the linearity adjustment circuit 330 may be seen as including a gain actuator circuit 332, a linearity controller 334, and a linearity diagnostic circuit 336 (shown in FIG. 3 by being enclosed within a dotted contour of the linearity adjustment circuit 330). In some embodiments, the linearity actuator circuit 322 together with the gain actuator circuit 332 may be seen as implementing the power amplifier actuator 112 of the linearity optimizer 110 (shown in FIG. 3 by having the linearity actuator circuit 322 and the gain actuator circuit 332 enclosed within a dashed contour of the power amplifier actuator 112), while the DPD adaptation circuit 324 together with the linearity controller 334 and the linearity diagnostic circuit 336 may be seen as implementing the linearity adaptation circuit 114 of the linearity optimizer 110 (shown in FIG. 3 by having the DPD adaptation circuit 324, the linearity controller 334, and the linearity diagnostic circuit 336 enclosed within a dashed contour of the linearity adaptation circuit 114).

It should be noted that the above-described assignment of what is included in the DPD circuit 320, the linearity adjustment circuit 330, the power amplifier actuator 112, and the linearity adaptation circuit 114 is merely illustrative to depict various functions involved in implementing the linearity optimizer 110. In alternative configurations/embodiments of the RF transceiver 100, different and/or additional components may be included in each of the DPD circuit 320, the linearity adjustment circuit 330, the power amplifier actuator 112, and the linearity adaptation circuit 114, all of which configurations/embodiments being within the scope of the present disclosure. Further, functionality attributed to any component of the linearity optimizer 110 may be accomplished by a different component included in the linearity optimizer 110 (e.g., the linearity optimizer 110 as shown in FIG. 3) or by a different system than what is illustrated in FIG. 3.

What is drastically different in the RF transceiver 300, compared to conventional implementations of RF transceivers, is the presence of two loops formed by the DPD circuit 320 and the linearity adjustment circuit 330. In particular, one loop (shown in FIG. 3 as a dash-dotted loop 338) is formed by the coupling between the linearity adjustment circuit 330, the transmitter circuit 120, the power amplifier array 130, the feedback signal 131, the receiver circuit 140, and the feedback signal y being provided back to the linearity adjustment circuit 330. In the loop 338, the output signal u from the linearity adjustment circuit 330 is provided to the transmitter circuit 120 which processes its input to produce an output signal from the transmitter circuit 120, which signal is then provided to the power amplifier array 130. Then the output z of the power amplifier array 130 is used to generate the feedback signal 131 which is provided to the receiver circuit 140, and the receiver circuit 140 then produces the feedback signal y, which is provided back to the linearity adjustment circuit 330, thus closing the loop 338. Another loop (shown in FIG. 3 as a dash-double-dotted loop 328) is formed by the coupling between the DPD circuit 320, the linearity adjustment circuit 330, the transmitter circuit 120, the power amplifier array 130, the feedback signal 131, the receiver circuit 140, and the feedback signal y being provided back to the DPD circuit 320. In the loop 328, the output signal v from the DPD circuit 320 is provided as an input to the linearity adjustment circuit 330, which generates the output signal u, provided to the transmitter circuit 120 which processes its input to produce an output signal from the transmitter circuit 120, which signal is then provided to the power amplifier array 130. Then the output z of the power amplifier array 130 is used to generate the feedback signal 131 which is provided to the receiver circuit 140, and the receiver circuit 140 then produces the feedback signal y, which is provided back to the DPD circuit 320, thus closing the loop 328. The loop 338 may be seen as an inner loop and the loop 328—as an outer loop in that the loop 338 is enclosed by the loop 328.

The linearity actuator circuit 322 is configured to apply predistortion (or, more generally, modification) to an input signal provided to the linearity actuator circuit 322, e.g., to the input signal x, thereby generating an output signal v, as shown in FIG. 3. The DPD adaptation circuit 324 is configured to use the feedback signal y to generate model/DPD coefficients (or, more generally, one or more DPD adaptation parameters) to be used by the linearity actuator circuit 322 to apply the predistortion to the input signal x. In various embodiments, the DPD circuit 320 may include any DPD circuit configured to apply such predistortion. Many of such circuits are known in the art and, therefore, are not described here in further detail.

The linearity diagnostic circuit 336 is configured to use the feedback signal y to compute values of one or more linearity parameters (e.g., EVM, ACLR, etc.) indicative of the linearity of the output z of the power amplifier array 130. With reference to one such linearity parameter, the linearity diagnostic circuit 336 may be then configured to compare the computed value of the linearity parameter with a target/desired value (which value may, in various embodiments, be preprogrammed, predefined, dynamically defined based on various operating conditions, provided to the RF transceiver 300 by a user, etc.) and generate a linearity error ($\varepsilon$) indicative of a difference between the computed and the target values of the linearity parameter. Thus, the linearity diagnostic circuit 336 may be seen as computing/quantifying the deviation of the behavior of the power amplifier array 130 from the linear behavior based on the difference (e.g., the linearity error $\varepsilon$) between a target value of a linearity parameter and an actual value of the linearity parameter, the actual value of the linearity parameter determined based on the feedback signal y. The linearity diagnostic circuit 336 may provide the linearity error to the linearity controller 334 (in a signal 337, shown in FIG. 3) which may then generate a linearity control signal 335 based on the linearity error 337. The linearity control signal 335 is provided to the gain actuator circuit 332. The gain actuator circuit 332 is configured to adjust/modify the output signal v from the linearity actuator circuit 322 based on the linearity control signal 335 (i.e., based on the deviation from the linear behavior computed by the linearity diagnostic circuit 336), thereby generating the output signal u from the linearity optimizer 110, as shown in FIG. 3. In this manner, the power amplifier array 130 is configured to generate the output z based on the output v of the linearity actuator circuit 322 and further based on the linearity control signal 335 (e.g., by being driven with a signal based on the adjusted DPD output, u).

In some embodiments, the linearity control signal 335 may include one or more parameters computed by the linearity controller 334 to maximize a power of the output z of the power amplifier while ensuring that the linearity error computed by the linearity diagnostic circuit 336 is below a threshold ($\varepsilon_{min}$). For example, in some embodiments, such one or more parameters may include one or more gain values (e.g., included in a vector of N complex gains, as described above), where the linearity adjustment circuit 330 (in particular, the gain actuator circuit 332 of the linearity adjustment circuit 330) is configured to apply the one or more gain values to the DPD output (v) to generate the adjusted DPD output (u). Mathematically, this means that the linearity controller 334 may be configured to find a particular parameterisation (i.e., elements of the gain vector θ) that maximises the output power of the power amplifier array 130 (e.g., determined for the output signal u as $$\frac{1}{2N} \sum_{m=-N}^{N} |u(n)|^2)$$

while ensuring the deviation from a linear behaviour is below a minimum acceptable level $\varepsilon_{min}$ (e.g., while ensuring that $|x-y|^2 < \varepsilon_{min}$). In some embodiments, the linearity adjustment circuit 330 (e.g., the linearity controller 334) may be configured to increase the one or more gain values when the linearity error indicates that a linearity of the output z of the power amplifier array 130 satisfies one or more criteria for the output of the power amplifier array 130 to be considered linear, or decrease the one or more gain values when the linearity error indicates that the linearity of the output z of the power amplifier array 130 fails to satisfy the one or more criteria for the output of the power amplifier array 130 to be considered linear. In some embodiments, the gain values may be increased only up to a certain, e.g., predefined, maximum gain value. Similarly, in some embodiments, the gain values may be decreased only down to a certain, e.g., predefined, minimum gain value. For example, the RF transceiver 300 may be provided with an input device (e.g., an input device 1012, shown in FIG. 10) configured to enable a user to set the predefined maximum gain value and/or the predefined minimum gain value.

Figure 4:
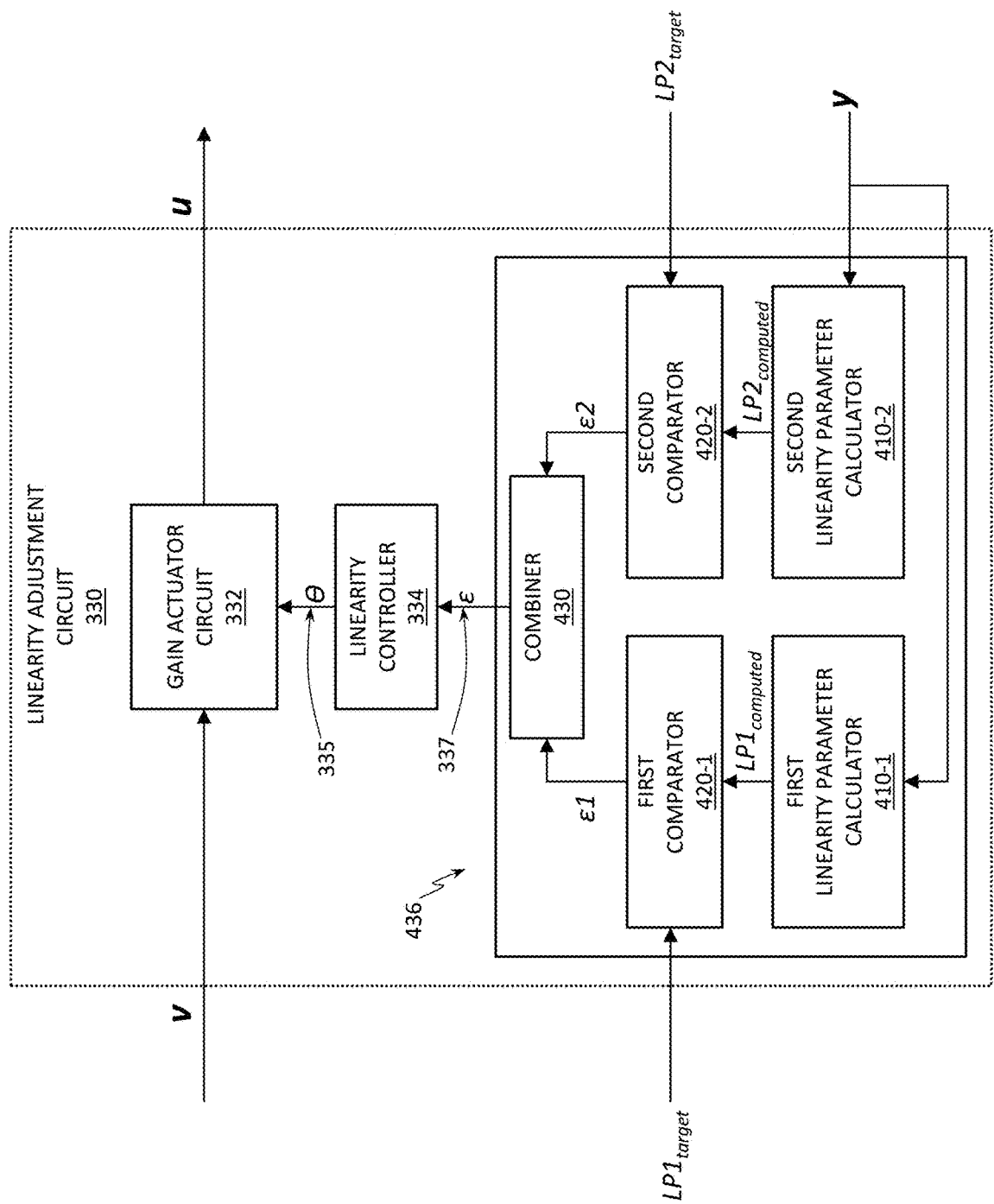
FIG. 4 provides a schematic block diagram of the linearity adjustment circuit of the linearity optimizer of the RF transceiver shown FIG. 3, further illustrating an example implementation of a linearity diagnostic circuit with multiple linearity parameters, according to some embodiments of the present disclosure.

FIG. 4 provides a schematic block diagram of the linearity adjustment circuit 330 of the linearity optimizer 110 of the RF transceiver 300 shown FIG. 3, according to some embodiments of the present disclosure. In particular, FIG. 4 illustrates a linearity diagnostic circuit 446, which is an example implementation of the linearity diagnostic circuit 336 when multiple linearity parameters are used.

The linearity diagnostic circuit 446 may include a plurality of linearity parameter calculators 410, e.g., the first and second calculators 410-1, 410-2, shown in FIG. 4, each of which is configured to receive the feedback signal y and compute a respective linearity parameter for the received signal. For example, the first linearity parameter calculator 410-1 may be configured to compute the EVM based on the feedback signal y, while the second linearity parameter calculator 410-2 may be configured to compute the ACLR based on the feedback signal y. The linearity diagnostic circuit 446 may further include a plurality of comparators 420, e.g., the first and second comparators 420-1, 420-2, shown in FIG. 4, configured to receive the linearity parameters computed by the respective linearity parameter calculators 410-1, 410-2 and configured to receive target values of the linearity parameters and compute respective errors (or error parameters) indicative of the differences between the computed and the target values of the linearity parameters. For example, the first comparator 420-1 may be configured to compute a first error parameter (labeled in FIG. 4 as "$\varepsilon 1$") based on the difference between the target value (labeled in FIG. 4 as "$LP1_{target}$", e.g., the target value for the EVM) of the first linearity parameter and the value (labeled in FIG. 4 as "$LP1_{computed}$") of the first linearity parameter computed by the first linearity parameter calculator 410-1. In some embodiments, the first error parameter may be computed as $\varepsilon 1 = 1 - 10^{\wedge}((LP1_{computed} - LP1_{target})/20)$, where $LP1_{computed}$ and $LP1_{target}$ are provided in logarithmic form. Similarly, the second comparator 420-2 may be configured to compute a second error parameter (labeled in FIG. 4 as "$\varepsilon 2$") based on the difference between the target value (labeled in FIG. 4 as "$LP2_{target}$", e.g., the target value for the ACLR) of the second linearity parameter and the value (labeled in FIG. 4 as "$LP2_{computed}$") of the second linearity parameter computed by the second linearity parameter calculator 410-2. In some embodiments, the first error parameter may be computed as $\varepsilon 2 = 1 - 10^{\wedge}((LP2_{computed} - LP2_{target})/20)$. Of course, in other embodiments, more than two branches of linearity parameter calculators 410 and associated comparators 420 may be used in the linearity diagnostic circuit 446, all of which embodiments being within the scope of the present disclosure.

The linearity diagnostic circuit 446 may further include a combiner 430, configured to receive the error parameters generated by the plurality of comparators 420 and use those to generate the linearity error 337 (labeled in FIG. 4 as "$\varepsilon$") based on the received error parameters. For example, the combiner 430 may be configured to generate the linearity error 337 based on (e.g., substantially equal to) the minimum of the first error parameter $\varepsilon 1$ and the second error parameter $\varepsilon 2$. The linearity controller 334 may then be configured to generate the linearity control signal 335 that may include a vector of complex gains (labeled in FIG. 4 as "θ") based on the received linearity error 337, e.g., as described above.

Figure 5:
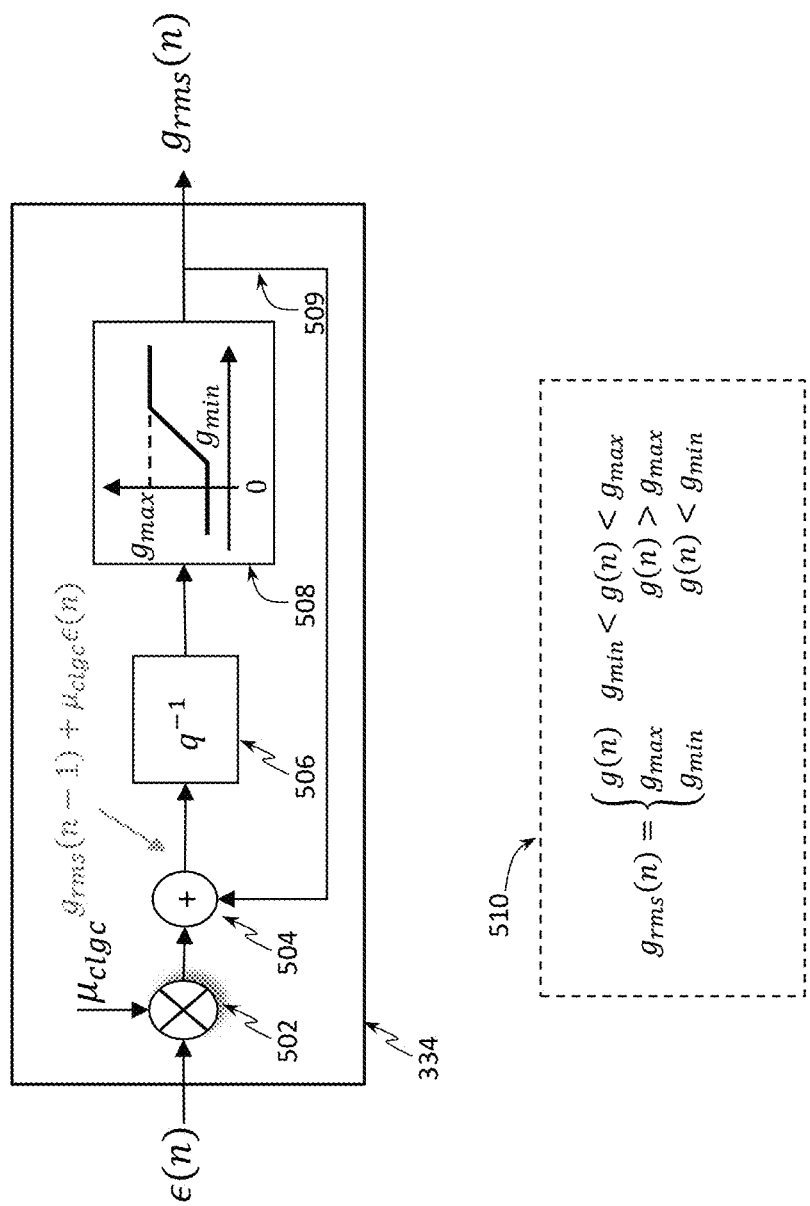
FIG. 5 provides a schematic block diagram illustrating an example implementation of the linearity controller of the linearity adjustment circuit shown of FIG. 3 or 4 being used to implement gain control for the drive signal of an amplifier, according to some embodiments of the present disclosure.

FIG. 5 provides a schematic block diagram illustrating an example implementation of the linearity controller 334 of the linearity adjustment circuit 330 of FIG. 3 or 4 being used to implement gain control of the drive signal for an amplifier (e.g., the power amplifier array 130), according to some embodiments of the present disclosure. As shown in FIG. 5, the linearity controller 334 may be configured to receive the linearity error 337 (labeled in FIG. 5 as "$\varepsilon(n)$"), where $\varepsilon(n)$ is the linearity error $\varepsilon$ for the current iteration, n, of the loop 338, as well as $\mu_{clgc}$, which is a real scalar (gain), greater than zero, chosen to affect the transient response (dynamics) of the loop. In some embodiments, the linearity controller 334 may include a multiplier 502, configured to multiply $\varepsilon(n)$ and $\mu_{clgc}$, and provide the result to an adder 504, configured to combine the product of $\varepsilon(n)$ and $\mu_{clgc}$ with the gain values produced in the last iteration of the loop 338, e.g., with $g_{rms}(n-1)$, provided to the adder 504 as a feedback signal 509. The linearity controller 334 may include a single sample delay unit 506, configured to delay the summation result of the adder 504, and a minimum and maximum limiter 508, configured to limit the gain by applying the minimum and maximum cut-off values for the gain to compute the gain values $g_{rms}(n)$, as shown in FIG. 5 (e.g., as shown in an inset 510, illustrated in FIG. 5).

Next, a few example methods of operating the RF transceiver 100 according to any embodiments described herein (e.g., according to any implementations described with references to FIGS. 1-5) will be discussed.

FIG. 6 provides a flow chart of a method 600 for operating an RF transceiver with a linearity optimizer that uses a vector of complex gains, according to some embodiments of the present disclosure. Such a linearity optimizer may be, e.g., the linearity optimizer 110 according to any embodiments described herein (e.g., according to any implementations described with references to FIGS. 1-5).

The method 600 may begin with a step 602 that includes a linearity adaptation circuit (e.g., the linearity adaptation circuit 114 of the linearity optimizer 110) generating a vector of complex gains based on the feedback signal y based on the output z of a power amplifier. For example, the step 602 may include the linearity controller 334 generating the vector θ of complex gains based on one or more linearity parameters computed by the linearity diagnostic circuit 336 based on the feedback signal y based on the output z of the power amplifier array 130, as described above. As described above, the linearity adaptation circuit 114 may be configured to determine the vector of complex gains in a manner that maximizes a power of the actuator output while ensuring that a deviation of the behavior of the power amplifier array from a linear behavior, determined based on the actuator input and the feedback signal, is below a threshold ($\varepsilon_{min}$).

The method 600 may further include a step 604 that includes a power amplifier actuator (e.g., the power amplifier actuator 112 of the linearity optimizer 110) generating an actuator output based on an input signal to the actuator and based on the vector of complex gains generated in step 604. For example, the step 604 may include the power amplifier actuator 112 generating the actuator output signal u based on the actuator input signal x and the vector θ of complex gains computed in step 602, as described above. In this manner, the vector of complex gains affects/modifies the input signal x, thereby modifying the drive signal to be provided to the to the power amplifier array 130.

The method 600 may further include a step 606 that includes a power amplifier array (e.g., the power amplifier array 130) generating a power amplifier output based on the output of the actuator, generated in step 604. For example, the step 606 may include the power amplifier array 130 generating the output signal z based on the actuator output signal u, as described above. In this manner, the output z of the power amplifier array 130 is modified based on the vector of complex gains because this vector was applied to modify the drive signal for the power amplifier array 130.

FIG. 7 provides a flow chart of a method 700 for operating an RF transceiver with a linearity optimizer that employs two loops, according to some embodiments of the present disclosure. Such a linearity optimizer may be, e.g., the linearity optimizer 110 with the loops 328 and 338 according to any embodiments described herein (e.g., according to any implementations described with references to FIGS. 3-5).

The method 700 may begin with a step 702 that includes a linearity actuator circuit (e.g., the linearity actuator circuit 322 of the linearity optimizer 110) generating a DPD output based on an input signal to the linearity actuator circuit and further based on the feedback signal y based on the output z of a power amplifier. For example, the step 702 may include the linearity actuator circuit 322 generating the DPD output v based on the input signal x and the feedback signal y, as described above.

The method 700 may further include a step 704 that includes a gain actuator circuit (e.g., the gain actuator circuit 332 of the linearity optimizer 110) generating an actuator output based on the DPD output generated in step 702 and further based on a linearity error. For example, the step 704 may include the gain actuator circuit 332 generating the actuator output signal u based on the DPD output v and the linearity error E, generated by the linearity controller 334, indicative of the difference between the computed value of the linearity parameter and a target value of the linearity parameter for one or more linearity parameters (e.g., EVM, ACLR), as described above. In this manner, the linearity error generated by the linearity controller 334 affects/modifies the input signal x, thereby modifying the drive signal to be provided to the power amplifier array 130.

The method 700 may further include a step 706 that includes a power amplifier array (e.g., the power amplifier array 130) generating a power amplifier output based on the output of the actuator, generated in step 704. For example, the step 706 may include the power amplifier array 130 generating the output signal z based on the actuator output signal u, as described above. In this manner, the output z of the power amplifier array 130 is modified based on the DPD output generated in step 702 and further based on the linearity error £ generated by the linearity controller 334.

Example Linearity Optimizers Configured to Adjust Bias Signals to Amplifiers

Figure 8:
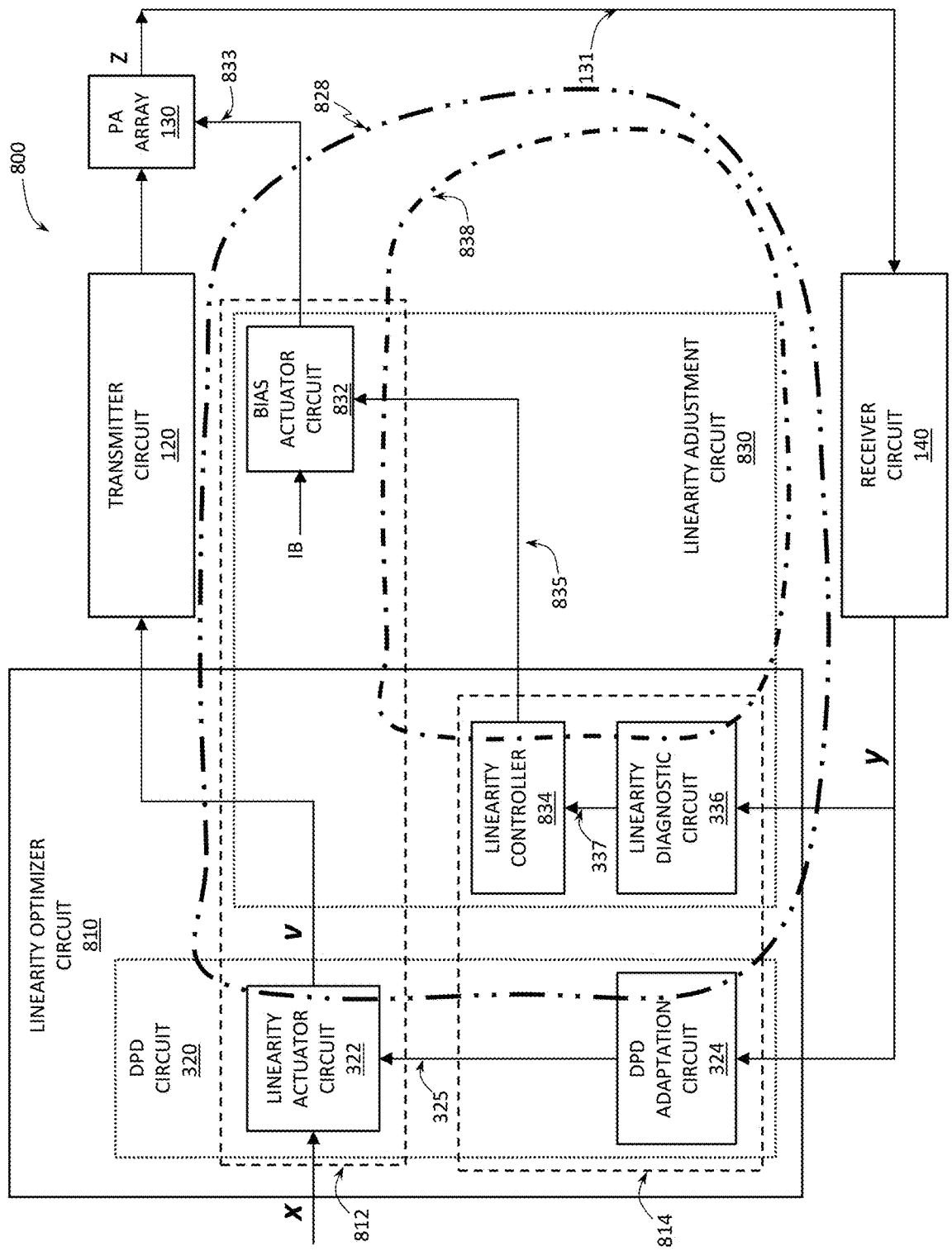
FIG. 8 provides a schematic block diagram of an RF transceiver with a linearity optimizer configured to adjust the bias signal for an amplifier, according to some embodiments of the present disclosure.

Inventors of the present disclosure further realized that an approach similar to that described above may be applied to modifying a bias signal provided to a power amplifier, instead of modifying the drive signal (e.g., the signal u, described above). FIG. 8 provides a schematic block diagram of an RF transceiver 800 with a linearity optimizer 810 configured to adjust the bias signal for an amplifier, according to some embodiments of the present disclosure. The RF transceiver 800 shown in FIG. 8 is similar to the RF transceiver 300 shown in FIG. 3, where the same reference numerals as described above refer to the same or analogous elements/components so that descriptions provided with respect to one of these figures are assumed to be applicable and do not have to be repeated for the other, and only the differences are described. In particular, the RF transceiver 800 includes the DPD circuit 320, the transmitter and receiver circuits 120, 140, and the power amplifier array 130, as described above. In some embodiments of the RF transceiver 800, the transmitter and the receiver circuits 120, 140 may be implemented as described with reference to the RF transceiver 200.

The linearity optimizer 810 is similar to the linearity optimizer 110 described with reference to FIG. 3 in that, besides including the DPD circuit 320, the linearity optimizer 810 further includes a linearity adjustment circuit 830, with the DPD circuit 320 and the linearity adjustment circuit 830 serving different functions. The DPD circuit 320 is configured to provide the DPD function as described with reference to FIG. 3, while the linearity adjustment circuit 830 is configured to provide the bias signal adjustment function. To that end, the linearity adjustment circuit 830 may be seen as including the linearity diagnostic circuit 336 as described with reference to FIG. 3, as well as a bias actuator circuit 832 and a linearity controller 834 (shown in FIG. 8 by being enclosed within a dotted contour of the linearity adjustment circuit 830, similar to the notation used in FIG. 3). In some embodiments, the linearity actuator circuit 322 together with the bias actuator circuit 832 may be seen as implementing a power amplifier actuator 812 of the linearity optimizer 810 (shown in FIG. 8 by having the linearity actuator circuit 322 and the bias actuator circuit 832 enclosed within a dashed contour of the power amplifier actuator 812), while the DPD adaptation circuit 324 together with the linearity controller 834 and the linearity diagnostic circuit 336 may be seen as implementing a linearity adaptation circuit 814 of the linearity optimizer 810 (shown in FIG. 8 by having the DPD adaptation circuit 324, the linearity controller 834, and the linearity diagnostic circuit 336 enclosed within a dashed contour of the linearity adaptation circuit 814).

It should be noted that the above-described assignment of what is included in the DPD circuit 320, the linearity adjustment circuit 830, the power amplifier actuator 812, and the linearity adaptation circuit 814 is merely illustrative to depict various functions involved in implementing the linearity optimizer 810. In alternative configurations/embodiments of the RF transceiver 800, different and/or additional components may be included in each of the DPD circuit 320, the linearity adjustment circuit 830, the power amplifier actuator 812, and the linearity adaptation circuit 814, all of which configurations/embodiments being within the scope of the present disclosure. Further, functionality attributed to any component of the linearity optimizer 810 may be accomplished by a different component included in the linearity optimizer 810 or by a different system than what is illustrated in FIG. 8.

The linearity diagnostic circuit 336 may be configured to generate the linearity error 337 according to any embodiments described above. The linearity controller 834 may then use the received linearity error 337 to generate a control signal 835 indicative of how a bias signal to the power amplifier array 130 should be adjusted in a manner that maximizes a power of the power amplifier output z while ensuring that a deviation of the behavior of the power amplifier array from a linear behavior, determined based on the input signal x and the feedback signal y, is below a threshold ($\varepsilon_{min}$). The bias actuator circuit 832 is configured to adjust/modify the bias signal (labeled in FIG. 8 as a bias current "IB") based on the linearity control signal 835 (i.e., based on the deviation from the linear behavior computed by the linearity diagnostic circuit 336), thereby generating a modified bias signal 833, as shown in FIG. 8, which signal is then used to bias the power amplifier array 130. In this manner, the power amplifier array 130 is configured to generate the output z based on the output v of the linearity actuator circuit 322 and further based on the linearity control signal 835 (e.g., by the power amplifier array 130 being driven with the bias signal 833). For example, in some embodiments, the linearity control signal 835 may be a digital control word to a DAC which in turn modulates the current source configured to provide the bias current. In other embodiment of the RF transceiver 800, instead of using a current source, the bias may be realized through a similar voltage regulation scheme.

Similar to the RF transceiver 300, what makes the RF transceiver 800 unique compared to conventional implementations of RF transceivers is the presence of two loops formed by the DPD circuit 320 and the linearity adjustment circuit 830. In particular, one loop (shown in FIG. 8 as a dash-dotted loop 838) is formed by the coupling between the linearity adjustment circuit 830, the power amplifier array 130, the feedback signal 131, the receiver circuit 140, and the feedback signal y being provided back to the linearity adjustment circuit 830. In the loop 838, the output signal 833 is the bias signal used to bias the power amplifier array 130 to generate the output z, while the power amplifier array 130 is driven with a drive signal based on the output v of the linearity actuator circuit 322. Then the output z of the power amplifier array 130 is used to generate the feedback signal 131 which is provided to the receiver circuit 140, and the receiver circuit 140 then produces the feedback signal y, which is provided back to the linearity adjustment circuit 830, thus closing the loop 838. Another loop (shown in FIG. 8 as a dash-double-dotted loop 828) is formed by the coupling between the DPD circuit 320, the transmitter circuit 120, the power amplifier array 130, the feedback signal 131, the receiver circuit 140, and the feedback signal y being provided back to the DPD circuit 320. In the loop 828, the output signal v from the DPD circuit 320 is provided as an input to the transmitter circuit 120 which processes its input to produce an output signal from the transmitter circuit 120, which signal is then used to form a drive signal for the power amplifier array 130. Then the output z of the power amplifier array 130 is used to generate the feedback signal 131 which is provided to the receiver circuit 140, and the receiver circuit 140 then produces the feedback signal y, which is provided back to the DPD circuit 320, thus closing the loop 828. The loop 838 may be seen as an inner loop and the loop 828—as an outer loop in that the loop 838 is enclosed by the loop 828.

In other aspects of the present disclosure, both the drive signal and the bias signal for the power amplifier array may be adjusted as described herein, i.e., the embodiments of the RF transceiver 300 and of the RF transceiver 800 may be combined.

Beamforming System to be Used with the Linearity Optimizers

RF transceivers with linearity optimizers as described herein, e.g., any embodiments of the RF transceivers with linearity optimizers as described with reference to FIGS. 1-8, may be particularly beneficial when implemented in context of a beamforming system, e.g., in context of a phased antenna array, in particular in a millimeter-wave beamforming system.

An antenna with a single antenna element will typically broadcast a radiation pattern that radiates equally in all directions in a spherical wavefront. Phased antenna arrays (also commonly referred to as "phase arrays") generally refer to a collection of antennas (where individual antennas are commonly referred to as "antenna elements") that are used to focus electromagnetic energy in a particular direction, thereby creating a main beam. Phased arrays offer numerous advantages over single-antenna systems, such as high gain, ability to perform directional steering, and simultaneous communication. Therefore, phased arrays are being used more frequently in a myriad of different applications, such as in mobile technology, cellular telephone and data, Wi-Fi technology, automotive radars, and airplane radars.

Each individual antenna element of a phased array may radiate in a spherical pattern, but, collectively, a plurality of such antenna elements may generate a wavefront in a particular direction (such a wavefront commonly referred to as a "main beam") through constructive and destructive interference. Namely, by carefully controlling the phase of signals radiated by different antenna elements, radiation patterns of different antenna elements may constructively interfere in a desired direction, creating the main beam in that direction, while interfering destructively in several other directions other than the direction of the main beam. Therefore, a phased array typically includes phase shift modules (also commonly referred to as "phase shifters"), configured to control the phase of signals radiated by different antenna elements.

Figure 9:
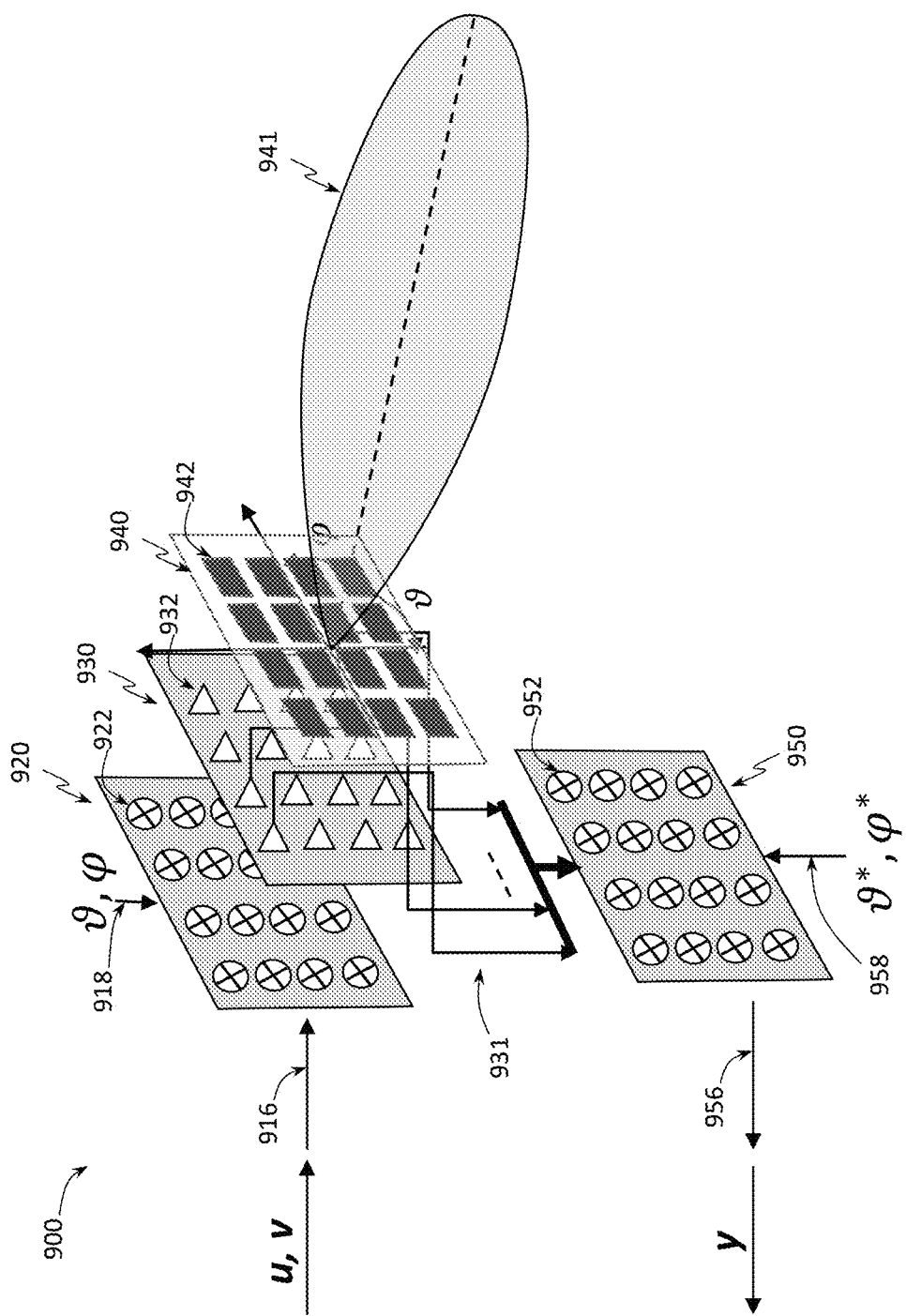
FIG. 9 provides a schematic block diagram of an RF transceiver with a linearity optimizer and a millimeter-wave beamforming arrangement, according to some embodiments of the present disclosure.

One example of a phased antenna array is shown in FIG. 9, providing a schematic block diagram of a beamformer arrangement 900, according to some embodiments of the present disclosure. The beamformer arrangement 900 may be implemented with any of the RF transceivers with linearity optimizers as described herein.

The beamformer arrangement 900 may include a transmit path (TX) beamformer array 920, a power amplifier array 930, an antenna array 940, and a receive path (RX) beamformer array 950. In some embodiments, each of the arrays may include the same number of elements (as is illustrated in FIG. 9 with each array showing 16 elements), so that there is one-to-one correspondence between the components from each of the TX beamformer array 920, the power amplifier array 930, the antenna array 940, and the RX beamformer array 950. However, in other embodiments, there may be one-to-many or many-to-one correspondence between various elements of the arrays shown in FIG. 9.

In general, the antenna array 940 may include one or more, typically a plurality of, antenna elements 942 (only one of which is labeled with a reference numeral in FIG. 9 in order to not clutter the drawing). In various embodiments, the antenna elements 112 may be radiating elements or passive elements. For example, the antenna elements 942 may include dipoles, open-ended waveguides, slotted waveguides, micro-strip antennas, and the like. In some embodiments, the antenna elements 942 may include any suitable elements configured to wirelessly transmit and/or receive RF signals. Although FIG. 9 illustrates a certain number of antenna elements 942, it is appreciated that various embodiments may be implemented with an array of any number of two or more antenna elements. Furthermore, it is understood that the embodiments disclosed herein may be implemented with different types of antenna arrays, such as time domain beamformers, frequency domain beamformers, dynamic antenna arrays, antenna arrays, passive antenna arrays, and the like.

Similarly, the TX beamformer array 920 may include one or more, typically a plurality of, beamformer taps 922 (only one of which is labeled with a reference numeral in FIG. 9 in order to not clutter the drawing). Each of the beamformer taps 922 may have, at least, two inputs and one output. The two inputs of the beamformer tap 922 include an input 918 indicative of a phase shift (e.g., the input 918 may include information indicative of angles $\vartheta$ and $\varphi$, which refer to, respectively, elevation and azimuth that the TX beam is steered to) and a TX signal 916, which is a signal based on the signals u or v, described above, i.e., an input signal of a lower frequency, e.g., the TX signal at IF. The one output of each of the beamformer taps 922 of the array 920 is an output to a corresponding power amplifier of the power amplifier array 930. The beamformer tap 922 may be configured to mix (e.g., multiply) the input signal 916 with the beamformer tap or weight. Given the angles provided in the input 918, the beamformer taps are calculated, as is well known to those skilled in the art. The taps or weights may be static complex gain values, one for each beamformer tap 922. The beamformer taps 922 may be complex gain multipliers, where the RF input is multiplied by the complex gain weight so that the RF output is a scaled, phase rotated version of the RF input (u or v).

Similar to the antenna array 940 and the TX beamformer array 920, the power amplifier array 930 may include one or more, typically a plurality of, power amplifiers 932 (only one of which is labeled with a reference numeral in FIG. 9 in order to not clutter the drawing). The power amplifier array 930 may be the power amplifier array 130, described above.

By carefully controlling the phase of signals radiated by different antenna elements 922, radiation patterns of different antenna elements may constructively interfere in a desired direction, creating a main beam 941 in that direction, while interfering destructively in several other directions other than the direction of the main beam 941.

Similar to the TX beamformer array 920, the RX beamformer array 950 may include one or more, typically a plurality of, beamformer taps 952 (only one of which is labeled with a reference numeral in FIG. 9 in order to not clutter the drawing). Each of the beamformer taps 952 may have, at least, two inputs and one output. The two inputs of the beamformer tap 952 may include an input 931, indicative of the output z from the power amplifier array 930, and an input 958 indicative of a phase shift (e.g., the input 958 may include information indicative of angles to which the DPD observation receiver 140 may be steered, which could, but do not have to be the conjugates of the TX angles 19 and $\varphi$ of the input 918). The one output of each of the beamformer taps 952 of the array 950 may be an output 956, which forms basis for the feedback signal y, described above. The beamformer tap 952 may be configured to mix (e.g., multiply) the input signal 931 with the beamformer tap or weight. The RX beamformer array 950 may be seen as the observation receiver beamformer (an array of complex multipliers equivalent to the TX counterpart 920) and combiner (adder [not shown]). Similar to 922, 952 are complex multipliers that take the RF input and multiply it by the static RX beamformer taps or weights. The output 956 is the combination (summation) of all the complex multiplier outputs. The RX beamformer array 950 may be seen as a spatial filter whose passband is typically (but not necessarily) tuned to the TX beam.

Example Data Processing System

Figure 10:
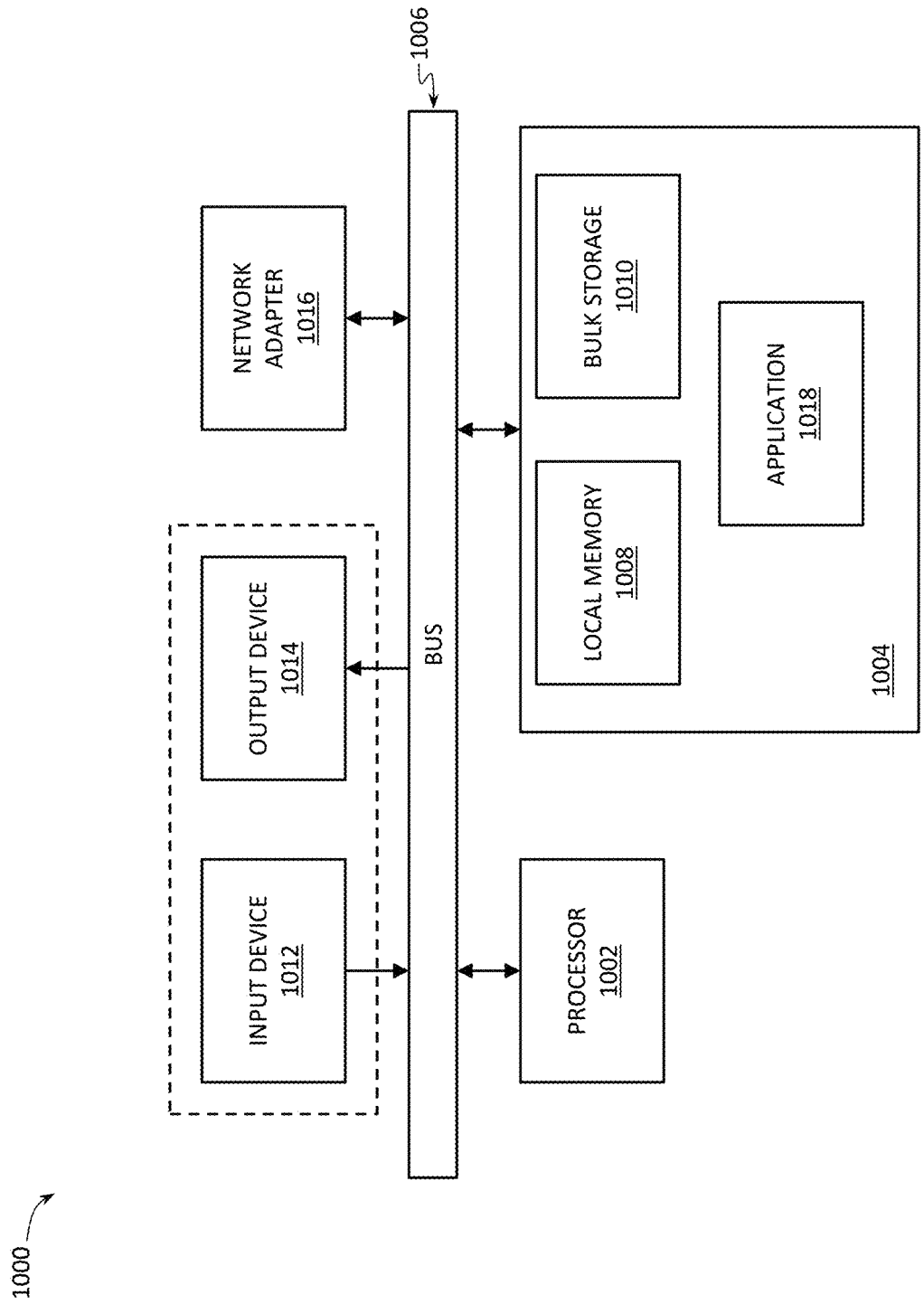
FIG. 10 provides a schematic block diagram of an example data processing system that may be configured to implement at least portions of an RF transceiver with a linearity optimizer, according to some embodiments of the present disclosure.

FIG. 10 provides a schematic block diagram of an example data processing system 1000 that may be configured to implement at least portions of an RF transceiver with a linearity optimizer, according to some embodiments of the present disclosure. For example, the data processing system 1000 may be used to implement at least portions of any of the components of an RF transceiver as described with reference to FIGS. 1-9, in particular, to implement at least portions of the linearity optimizers 110, 810, as described herein.

As shown in FIG. 10, the data processing system 1000 may include at least one processor 1002, e.g. a hardware processor 1002, coupled to memory elements 1004 through a system bus 1006. As such, the data processing system may store program code within memory elements 1004. Further, the processor 1002 may execute the program code accessed from the memory elements 1004 via a system bus 1006. In one aspect, the data processing system may be implemented as a computer that is suitable for storing and/or executing program code. It should be appreciated, however, that the data processing system 1000 may be implemented in the form of any system including a processor and a memory that is capable of performing the functions described within this disclosure.

In some embodiments, the processor 1002 can execute software or an algorithm to perform the activities as discussed in this specification, in particular activities related to various embodiments of the linearity optimizers, described herein. The processor 1002 may include any combination of hardware, software, or firmware providing programmable logic, including by way of non-limiting example a microprocessor, a DSP, a field-programmable gate array (FPGA), a programmable logic array (PLA), an integrated circuit (IC), an application specific IC (ASIC), or a virtual machine processor. The processor 1002 may be communicatively coupled to the memory element 1004, for example in a direct-memory access (DMA) configuration, so that the processor 1002 may read from or write to the memory elements 1004.

In general, the memory elements 1004 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 1000 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 1-4, 8, and 9, can also include suitable interfaces for receiving, transmitting, and/or otherwise communicating data or information in a network environment so that they can communicate with, e.g., the data processing system 1000 of another one of these elements.

In certain example implementations, mechanisms for implementing linearity optimizers as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 1004 shown in FIG. 10, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 1002 shown in FIG. 10, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 1004 may include one or more physical memory devices such as, for example, local memory 1008 and one or more bulk storage devices 1010. The local memory may refer to RAM or other non-persistent memory device(s) generally used during actual execution of the program code. A bulk storage device may be implemented as a hard drive or other persistent data storage device. The processing system 1000 may also include one or more cache memories (not shown) that provide temporary storage of at least some program code in order to reduce the number of times program code must be retrieved from the bulk storage device 1010 during execution.

As shown in FIG. 10, the memory elements 1004 may store an application 1018. In various embodiments, the application 1018 may be stored in the local memory 1008, the one or more bulk storage devices 1010, or apart from the local memory and the bulk storage devices. It should be appreciated that the data processing system 1000 may further execute an operating system (not shown in FIG. 10) that can facilitate execution of the application 1018. The application 1018, being implemented in the form of executable program code, can be executed by the data processing system 1000, e.g., by the processor 1002. Responsive to executing the application, the data processing system 1000 may be configured to perform one or more operations or method steps described herein.

Input/output (I/O) devices depicted as an input device 1012 and an output device 1014, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 1014 may be any type of screen display, such as plasma display, liquid crystal display (LCD), organic light emitting diode (OLED) display, electroluminescent (EL) display, or any other indicator, such as a dial, barometer, or light emitting diode (LED). In some implementations, the system may include a driver (not shown) for the output device 1014. Input and/or output devices 1012, 1014 may be coupled to the data processing system either directly or through intervening I/O controllers.

In an embodiment, the input and the output devices may be implemented as a combined input/output device (illustrated in FIG. 10 with a dashed line surrounding the input device 1012 and the output device 1014). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1016 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1000, and a data transmitter for transmitting data from the data processing system 1000 to said systems, devices and/or networks. Modems, cable modems, and Ethernet cards are examples of different types of network adapter that may be used with the data processing system 1000.

Example Simulations with and without Linearity Optimizers

FIGS. 11-14 provide some simulation results illustrating various advantages of using linearity optimizers as described herein.

In each of FIGS. 11-14, the two upper graphs illustrate the gain ($g_{rms}$), shown along the vertical axis, as a function of the number of iteration of an optimization algorithm, shown along the horizontal axis, without (the upper graph shown on the left) and with (the upper graph shown on the right) the linearity optimizer according to one of the embodiments of the present disclosure. On the other hand, the two lower graphs of each of FIGS. 11-14 illustrate the linearity (for the example of ACLR being the linearity parameter), shown along the vertical axis, as a function of the number of iteration of the algorithm, shown along the horizontal axis, without (the upper graph shown on the left) and with (the upper graph shown on the right) the linearity optimizer according to one of the embodiments of the present disclosure. Thus, the upper and lower graphs of the simulation shown on the left hand side of each of FIGS. 11-14 show, respectively, gain and linearity as functions of the number of iteration of a DPD algorithm when no linearity optimizer as described herein is used (i.e., one of conventional implementations of an RF transceiver where only DPD is used), while the upper and lower graphs of the simulation shown on the right hand side of each of FIGS. 11-14 show, respectively, gain and linearity as functions of the number of iteration of the algorithm when one of the linearity optimizers as described herein is used.

Figure 11:
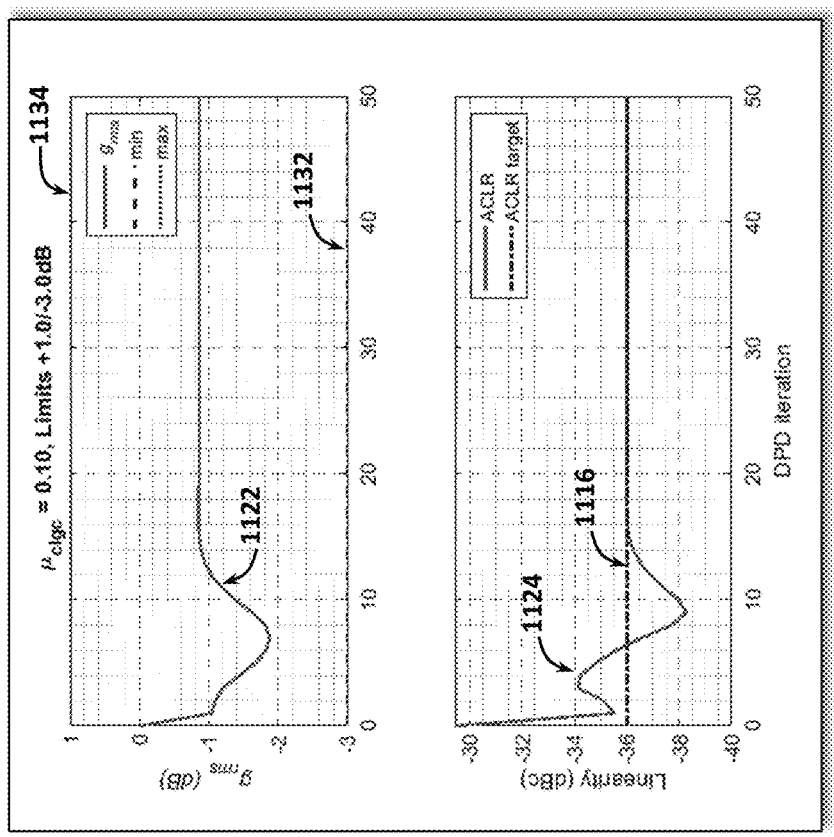
FIG. 11 illustrates graphs comparing linearity and gain without and with a linearity optimizer for an example scenario of linearity deficit, according to some embodiments of the present disclosure.
Figure 11:
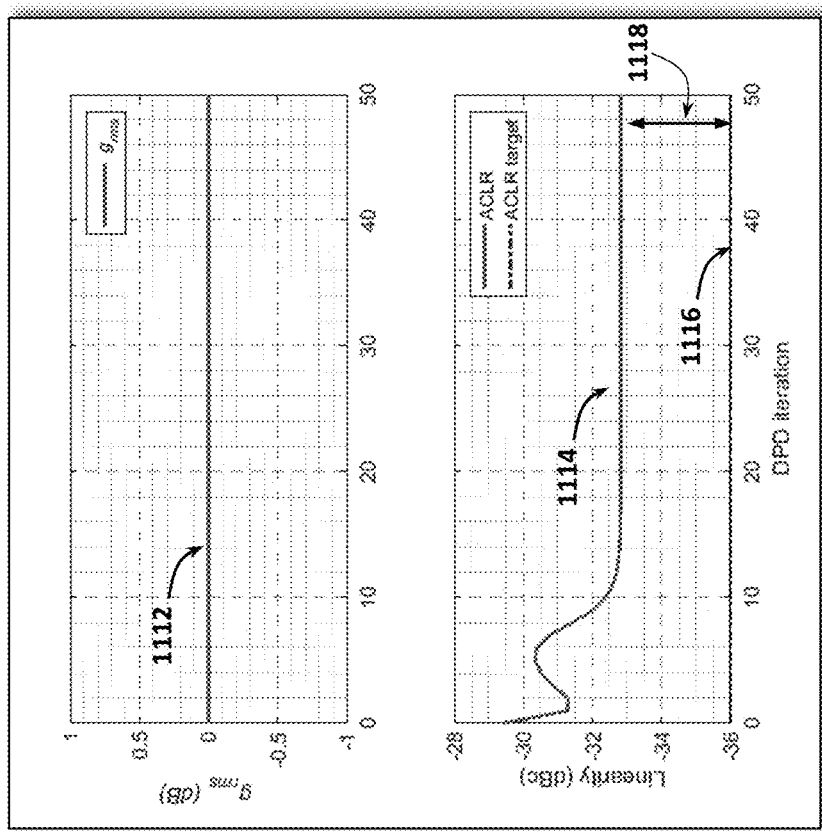

FIG. 11 illustrates graphs comparing linearity and gain without and with the linearity optimizer for an example scenario of linearity deficit, according to some embodiments of the present disclosure.

In particular, a curve 1112 of the upper graph on the left hand side of FIG. 11 illustrates the gain when no linearity optimizer is used. The curve 1112 illustrates that the gain is substantially equal to 0, i.e., is not varied, as the algorithm iterations progress. A curve 1114 of the lower graph on the left hand side of FIG. 11 illustrates the ACLR when no linearity optimizer is used. The curve 1114 illustrates that the linearity fluctuates at the first several iterations, and then settles (e.g., after about 12 iterations, as shown for the example simulation shown in FIG. 11) at a certain value (i.e., the flat portion of the curve 1114). The lower graph on the left hand side of FIG. 11 further illustrates a curve 1116, showing the target linearity. As can be seen in the lower graph on the left hand side of FIG. 11, the final value of the linearity (i.e., the flat portion of the curve 1114) is not as low as the target linearity of the curve 1116, with the difference 1118 illustrating the deficit in the linearity with conventional implementations of RF transceivers even when DPD is used.

On the other hand, a curve 1122 of the upper graph on the right hand side of FIG. 11 illustrates the gain when one of the linearity optimizers as described herein is used, e.g., the linearity optimizer 110 or 810. The curve 1122 illustrates that the gain is no longer static, but varies as the iterations progress. The curve 1122 also illustrates that the gain finally settles (e.g., after about 12 iterations, as shown for the example simulation shown in FIG. 11) at a certain value (i.e., the flat portion of the curve 1122). The curve 1122 further illustrates that the gain settles at a negative value, indicating that a back-off is implemented to achieve the desired linearity. Minimum and maximum values of the gain are also shown in the upper graph on the right hand side of FIG. 11, with curves (flat lines) 1132 and 1134, respectively. A curve 1124 of the lower graph on the right hand side of FIG. 11 illustrates the ACLR when one of the linearity optimizers as described herein is used, e.g., the linearity optimizer 110 or 810. The curve 1124 illustrates that the linearity fluctuates at the first several DPD iterations, and then settles (e.g., after about 12 DPD iterations, as shown for the example simulation shown in FIG. 11) at a certain value (i.e., the flat portion of the curve 1124). The lower graph on the right hand side of FIG. 11 further illustrates the curve 1116, showing the target linearity, which is the same as the one shown in the lower graph on the left hand side of FIG. 11. As can be seen in the lower graph on the right hand side of FIG. 11, the final value of the linearity (i.e., the flat portion of the curve 1124) is as low as the target linearity of the curve 1116, with the difference 1118 (i.e., the deficit in linearity) associated with conventional implementations of RF transceivers being eliminated due to the use of the linearity optimizer that decreased the gain (the curve 1122 in the upper graph on the right hand side of FIG. 11) to achieve a better balance between linearity and output power/efficiency.

Figure 12:
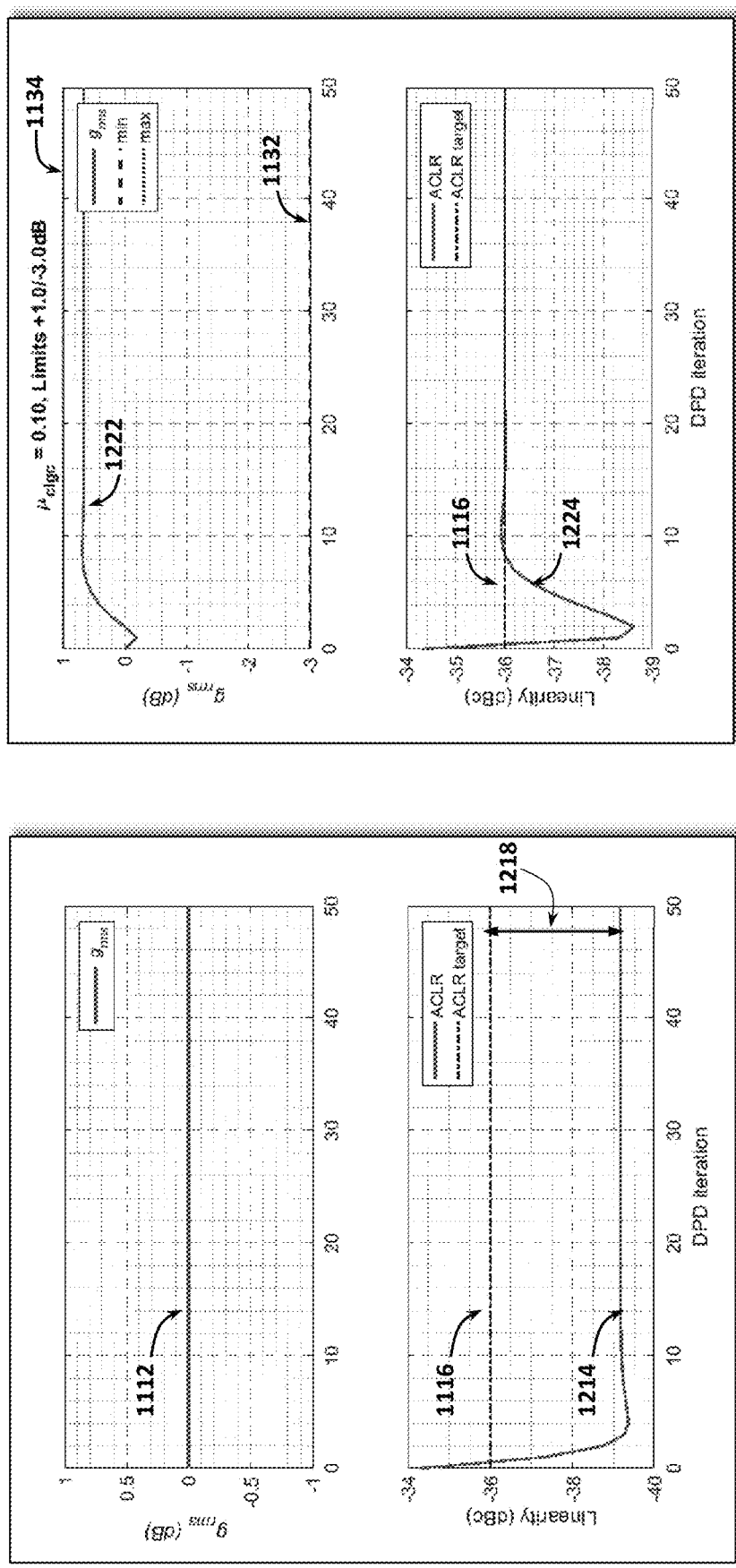
FIG. 12 illustrates graphs comparing linearity and gain without and with a linearity optimizer for an example scenario of linearity excess, according to some embodiments of the present disclosure.

FIG. 12 illustrates graphs comparing linearity and gain without and with the linearity optimizer for an example scenario of linearity excess, according to some embodiments of the present disclosure. In FIG. 12, as well as in FIG. 13 and FIG. 14, the curves 1112, 1116, 1132 and 1134 are the same as those described with reference to FIG. 11.

A curve 1214 of the lower graph on the left hand side of FIG. 12 illustrates the ACLR when no linearity optimizer is used. The curve 1214 illustrates that the linearity fluctuates at the first several DPD iterations, and then settles (e.g., after about 12 DPD iterations, as shown for the example simulation shown in FIG. 12) at a certain value (i.e., the flat portion of the curve 1214). As can be seen in the lower graph on the left hand side of FIG. 12, the final value of the linearity (i.e., the flat portion of the curve 1214) is below the target linearity of the curve 1116, with the difference 1218 illustrating the excess in the linearity with conventional implementations of RF transceivers when DPD is used.

On the other hand, a curve 1222 of the upper graph on the right hand side of FIG. 12 illustrates the gain when one of the linearity optimizers as described herein is used, e.g., the linearity optimizer 110 or 810. The curve 1222 illustrates that the gain is no longer static, but varies as the iterations progress. The curve 1222 also illustrates that the gain finally settles (e.g., after about 12 iterations, as shown for the example simulation shown in FIG. 12) at a certain value (i.e., the flat portion of the curve 1222). The curve 1122 further illustrates that the gain settles at a positive value, indicating that the power amplifier is driven with a larger signal to eliminate the excess linearity.

A curve 1224 of the lower graph on the right hand side of FIG. 12 illustrates the ACLR when one of the linearity optimizers as described herein is used, e.g., the linearity optimizer 110 or 810. The curve 1224 illustrates that the linearity fluctuates at the first several DPD iterations, and then settles (e.g., after about 12 DPD iterations, as shown for the example simulation shown in FIG. 12) at a certain value (i.e., the flat portion of the curve 1224). As can be seen in the lower graph on the right hand side of FIG. 12, the final value of the linearity (i.e., the flat portion of the curve 1224) is now aligned with the target linearity of the curve 1116, with the difference 1218 (i.e., the excess in linearity) associated with conventional implementations of RF transceivers being eliminated due to the use of the linearity optimizer that increased the gain and hence the drive and output power level (the curve 1222 in the upper graph on the right hand side of FIG. 12) to achieve a better balance between linearity and output power level/efficiency.

Figure 13:
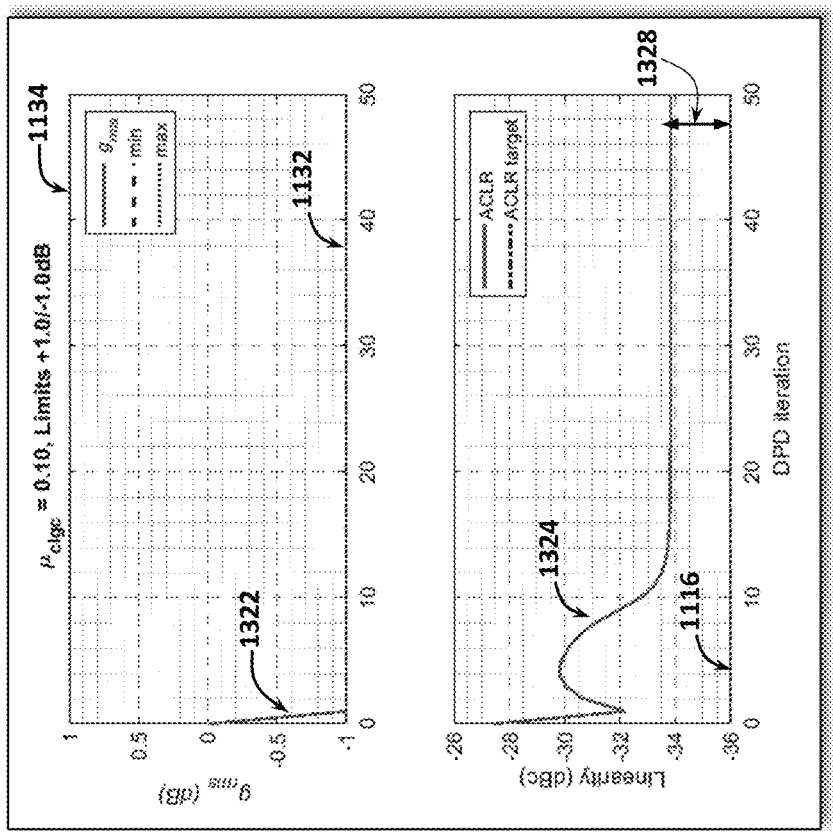
FIG. 13 illustrates graphs comparing linearity and gain without and with a linearity optimizer for an example scenario of linearity deficit in context of gain saturation, according to some embodiments of the present disclosure.
Figure 13:
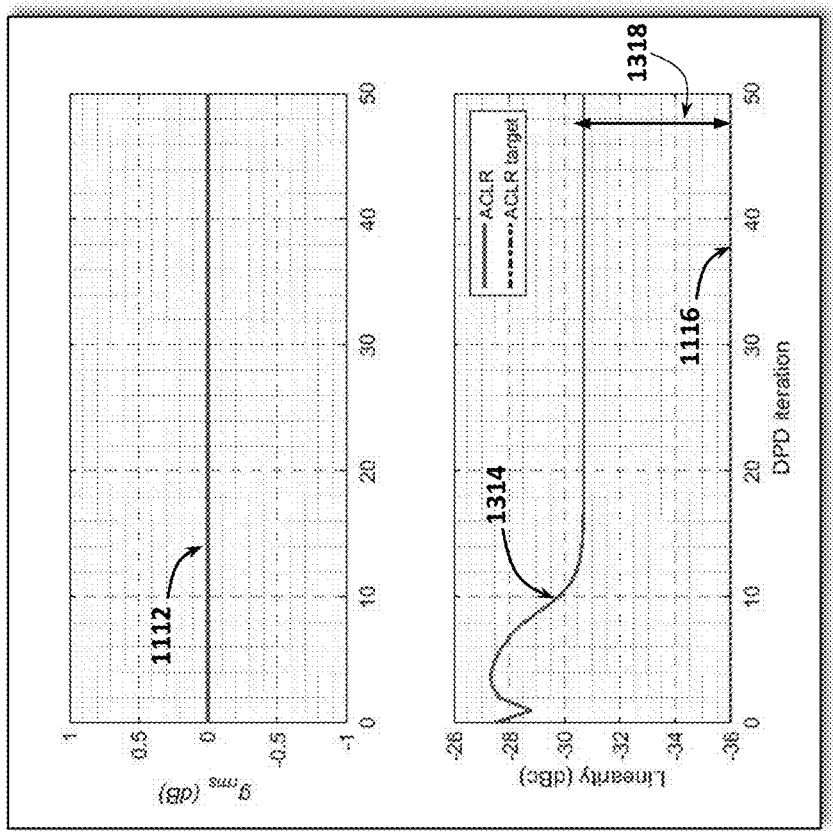

FIG. 13 illustrates graphs comparing linearity and gain without and with the linearity optimizer for an example scenario of linearity deficit in context of gain saturation, according to some embodiments of the present disclosure.

A curve 1314 of the lower graph on the left hand side of FIG. 12 illustrates the ACLR when no linearity optimizer is used. The curve 1314 illustrates that the linearity fluctuates at the first several iterations, and then settles (e.g., after about 12 iterations, as shown for the example simulation shown in FIG. 13) at a certain value (i.e., the flat portion of the curve 1314). As can be seen in the lower graph on the left hand side of FIG. 13, the final value of the linearity (i.e., the flat portion of the curve 1314) is not as low as the target linearity of the curve 1116, with the difference 1318 illustrating the deficit in the linearity with conventional implementations of RF transceivers even when DPD is used.

On the other hand, a curve 1322 of the upper graph on the right hand side of FIG. 13 illustrates the gain when one of the linearity optimizers as described herein is used, e.g., the linearity optimizer 110 or 810. The curve 1322 illustrates that the gain is no longer static, but varies as the iterations progress. The curve 1322 also illustrates that after a few iterations (e.g., after about 1-2 iterations, as shown for the example simulation shown in FIG. 13), the gain is clipped, i.e., saturated in that the linearity optimizer sets it to the minimum gain value (i.e., the flat portion of the curve 1322 coincides with the minimum gain shown with the curve 1132). The curve 1322 illustrates that the gain settles at a negative value, indicating that the power amplifier is driven with a decreased signal to decrease the linearity deficit.

A curve 1324 of the lower graph on the right hand side of FIG. 13 illustrates the ACLR when one of the linearity optimizers as described herein is used, e.g., the linearity optimizer 110 or 810. The curve 1324 illustrates that the linearity fluctuates at the first several DPD iterations, and then settles (e.g., after about 12 DPD iterations, as shown for the example simulation shown in FIG. 13) at a certain value (i.e., the flat portion of the curve 1324). As can be seen in the lower graph on the right hand side of FIG. 13, the final value of the linearity (i.e., the flat portion of the curve 1324) is improved with respect to the linearity of the curve 1314 in that the linearity deficit 1318 is decreased, but it is still not aligned with the target linearity of the curve 1116. The lower graph on the right hand side of FIG. 13 illustrates that there is still a difference 1328 between the final value of the linearity (i.e., the flat portion of the curve 1324) and the target linearity 1116, where the difference 1328 is the linearity deficit, a value that has, advantageously, been decreased (compared to the difference 1318) due to the use of the linearity optimizer that decreases the gain (the curve 1322 in the upper graph on the right hand side of FIG. 13). However, because this time, in contrast to the linearity excess scenario shown in FIG. 11, the gain cannot be decreased beyond a certain minimum value, the non-zero difference 1328 still remains.

Figure 14:
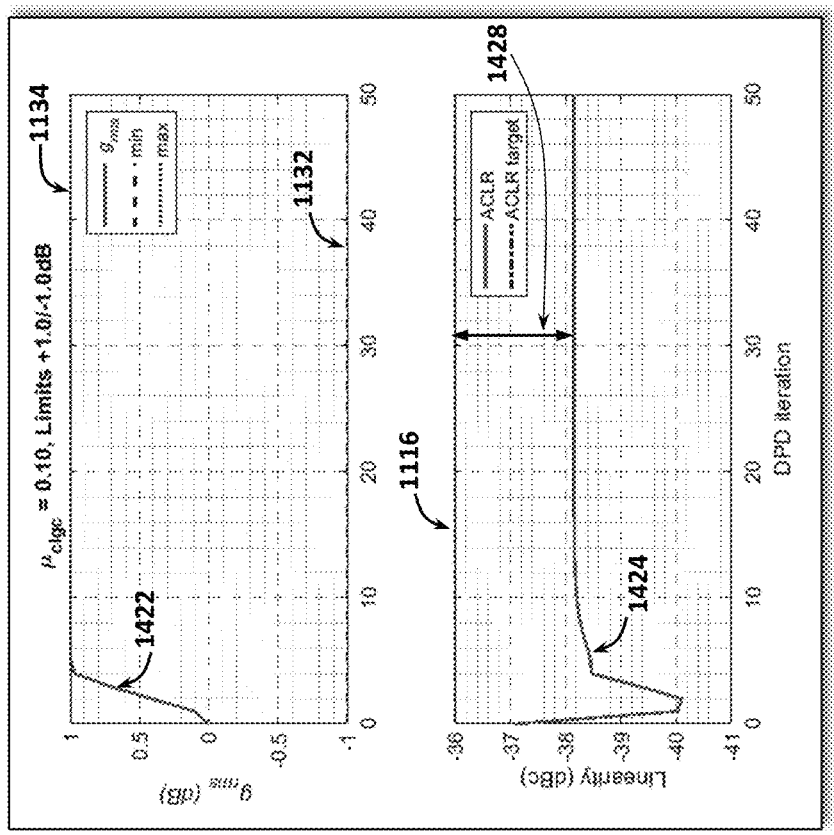
FIG. 14 illustrates graphs comparing linearity and gain without and with a linearity optimizer for an example scenario of linearity excess in context of gain saturation, according to some embodiments of the present disclosure.
Figure 14:
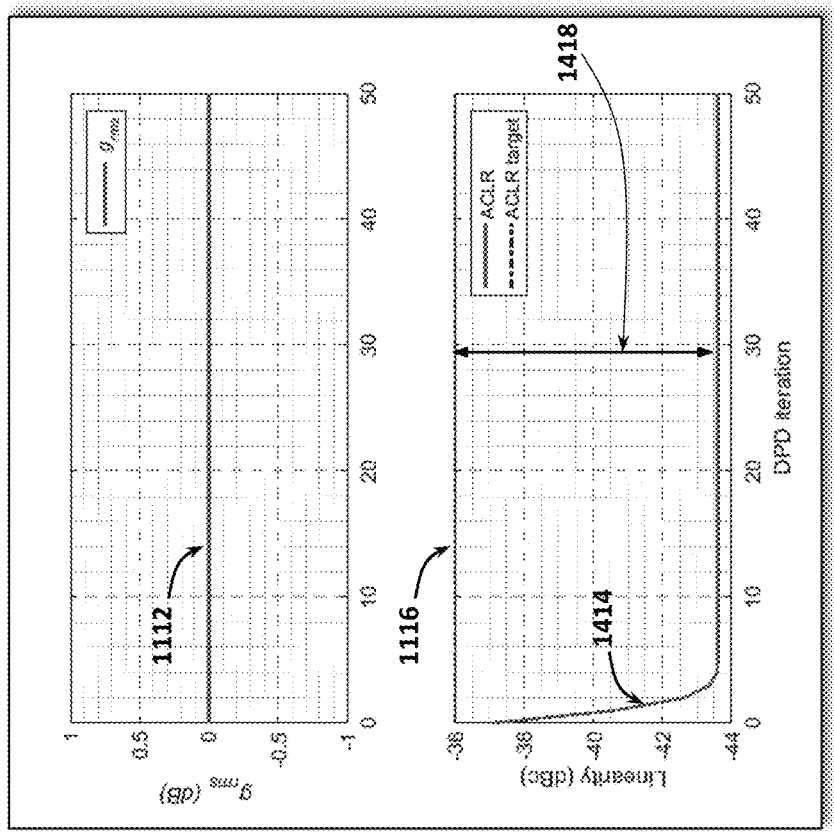

FIG. 14 illustrates graphs comparing linearity and gain without and with the linearity optimizer for an example scenario of linearity excess in context of gain saturation, according to some embodiments of the present disclosure.

A curve 1414 of the lower graph on the left hand side of FIG. 14 illustrates the ACLR when no linearity optimizer is used. The curve 1414 illustrates that the linearity fluctuates at the first several iterations, and then settles (e.g., after about 12 iterations, as shown for the example simulation shown in FIG. 14) at a certain value (i.e., the flat portion of the curve 1414). As can be seen in the lower graph on the left hand side of FIG. 14, the final value of the linearity (i.e., the flat portion of the curve 1414) is below the target linearity of the curve 1116, with the difference 1418 illustrating the excess in the linearity with conventional implementations of RF transceivers when DPD is used.

On the other hand, a curve 1422 of the upper graph on the right hand side of FIG. 14 illustrates the gain when one of the linearity optimizers as described herein is used, e.g., the linearity optimizer 110 or 810. The curve 1422 illustrates that the gain is no longer static, but varies as the iterations progress. The curve 1422 also illustrates that after a few iterations (e.g., after about 4-5 DPD iterations, as shown for the example simulation shown in FIG. 14), the gain is clipped, i.e., saturated in that the linearity optimizer sets it to the maximum gain value (i.e., the flat portion of the curve 1422 coincides with the maximum gain shown with the curve 1134). The curve 1422 illustrates that the gain settles at a positive value, indicating that the power amplifier is driven with a larger signal to decrease the linearity excess.

A curve 1424 of the lower graph on the right hand side of FIG. 14 illustrates the ACLR when one of the linearity optimizers as described herein is used, e.g., the linearity optimizer 110 or 810. The curve 1424 illustrates that the linearity fluctuates at the first several iterations, and then settles (e.g., after about 12 iterations, as shown for the example simulation shown in FIG. 14) at a certain value (i.e., the flat portion of the curve 1424). As can be seen in the lower graph on the right hand side of FIG. 14, the final value of the linearity (i.e., the flat portion of the curve 1424) is traded off with respect to the linearity of the curve 1414 in that the linearity excess 1418 is decreased to allow an increase in gain and enhance output power, but it is still not aligned with the target linearity of the curve 1116. The lower graph on the right hand side of FIG. 14 illustrates that there is still a difference 1428 between the final value of the linearity (i.e., the flat portion of the curve 1424) and the target linearity 1116, where the difference 1428 is the linearity excess, a value that has, advantageously, been decreased (compared to the difference 1418) due to the use of the linearity optimizer that increased the gain (the curve 1422 in the upper graph on the right hand side of FIG. 14). However, because this time, in contrast to the linearity excess scenario shown in FIG. 12, the gain cannot be increased beyond a certain maximum value, the non-zero difference 1428 still remains.

Select Examples

The following paragraphs provide some examples of various embodiments disclosed herein.

Example 1 provides an apparatus for a radio frequency (RF) transceiver, the apparatus including a digital predistortion (DPD) circuit 320 and a linearity adjustment circuit 330. The DPD circuit 320 is configured to generate a DPD output (v) based on an input (x) and a feedback signal (y) indicative of an output (z) of a power amplifier of the RF transceiver. The linearity adjustment circuit 330 is configured to compute a value of a linearity parameter based on the feedback signal, and generate a linearity control signal 335 based on a linearity error ($\varepsilon$) indicative of a difference between the computed value of the linearity parameter and a target value of the linearity parameter. The power amplifier is configured to generate the output of the power amplifier based on the DPD output and the linearity control signal.

Example 2 provides the apparatus according to example 1, where the linearity parameter is a first linearity parameter, the linearity adjustment circuit 330 is further configured to compute a value of a second linearity parameter based on the feedback signal, and the linearity error is further indicative of a difference between the computed value of the second linearity parameter and a target value of the second linearity parameter.

Example 3 provides the apparatus according to example 2, where the linearity adjustment circuit 330 is configured to compute a first error parameter ($\varepsilon1$) based on the difference between the target value ($LP1_{target}$) of the first linearity parameter and the computed value ($LP1_{computed}$) of the first linearity parameter, compute a second error parameter ($\varepsilon2$) based on the difference between the target value ($LP2_{target}$) of the second linearity parameter and the computed value ($LP2_{computed}$) of the second linearity parameter, and generate the linearity error based on the first error parameter and the second error parameter.

Example 4 provides the apparatus according to example 3, where the first error parameter is computed as $\varepsilon1=1-10\textasciicircum((LP1_{computed}-LP1_{target})/20)$, and the second error parameter is computed as $\varepsilon2=1-10\textasciicircum((LP2_{computed}-LP2_{target})/20)$.

Example 5 provides the apparatus according to examples 3 or 4, where the linearity error is generated as a value being equal to a minimum of the first error parameter and the second error parameter.

Example 6 provides the apparatus according to any one of examples 2-5, where the first linearity parameter is an error vector magnitude (EVM), and the second linearity parameter is an adjacent channel leakage ratio (ACLR).

Example 7 provides the apparatus according to any one of examples 1-6, where the linearity control signal 335 includes one or more parameters computed as to maximize a power of the output of the power amplifier while ensuring that the linearity error is below a threshold ($\varepsilon_{min}$).

Example 8 provides the apparatus according to example 7, where the one or more parameters include one or more gain values, the linearity adjustment circuit 330 is configured to apply the one or more gain values to the DPD output (v) to generate an adjusted DPD output (u), and the power amplifier is configured to generate the output of the power amplifier based on the DPD output and the linearity control signal by generating the output of the power amplifier based on the adjusted DPD output (e.g., by being driven with a signal based on the adjusted DPD output).

Example 9 provides the apparatus according to example 8, where the one or more gain values are included in a vector of complex gains generated by the linearity adjustment circuit 330.

Example 10 provides the apparatus according to examples 8 or 9, where the linearity adjustment circuit 330 is configured to increase the one or more gain values when the linearity error indicates that a linearity of the output of the power amplifier satisfies one or more criteria for the output of the power amplifier to be considered linear, and the linearity adjustment circuit 330 is configured to decrease the one or more gain values when the linearity error indicates that the linearity of the output of the power amplifier fails to satisfy the one or more criteria for the output of the power amplifier to be considered linear.

Example 11 provides the apparatus according to example 10, where the linearity adjustment circuit 330 is configured to increase the one or more gain values up to a predefined maximum gain value, and/or the linearity adjustment circuit 330 is configured to decrease the one or more gain values down to a predefined minimum gain value.

Example 12 provides the apparatus according to example 11, further including an input device configured to enable a user to set the predefined maximum gain value and/or the predefined minimum gain value.

Example 13 provides the apparatus according to example 7, where the one or more parameters include one or more bias values, the linearity adjustment circuit 330 is configured to apply the one or more bias values to a bias signal configured to bias the power amplifier to generate an adjusted bias signal configured to bias the power amplifier, and the power amplifier is configured to generate the output of the power amplifier based on the DPD output and the linearity control signal by generating the output of the power amplifier by being driven with a signal based on the DPD output and by being biased with the adjusted bias signal.

Example 14 provides an apparatus for use in a radio frequency (RF) transceiver, the apparatus including a linearity optimizer circuit 110 that includes a power amplifier actuator 112, i.e., an actuator for a power amplifier array of the RF transceiver, the actuator configured to receive an actuator input (x) and generate an actuator output (u); and a linearity adaptation circuit 114, configured to determine a vector of complex gains based on a feedback signal (y) indicative of an output of the power amplifier array. The output of the power amplifier array is based on the actuator output (the actuator output is configured to control operation of the power amplifier array), the actuator is configured to generate the actuator output based on the actuator input and the vector of complex gains, and the linearity adaptation circuit is configured to determine the vector of complex gains in a manner that maximizes a power of the actuator output while ensuring that a deviation of the behavior of the power amplifier array from a linear behavior, determined based on the actuator input and the feedback signal, is below a threshold ($\varepsilon_{min}$).

Example 15 provides the apparatus according to example 14, where the actuator 112 includes a linearity actuator circuit 322 and a gain actuator circuit 332, the linearity adaptation circuit 114 includes a DPD adaptation circuit 324 and a linearity diagnostic circuit 336, the DPD adaptation circuit is configured to compute one or more DPD adaptation parameters (e.g., DPD coefficients) based on the feedback signal, the linearity actuator circuit is configured to generate an output of the linearity actuator circuit based on the actuator input and the one or more DPD adaptation parameters computed by the DPD adaptation circuit, the linearity diagnostic circuit 336 is configured to compute the deviation from the linear behavior based on a difference ($\varepsilon$) between a target value of a linearity parameter and an actual value of the linearity parameter, the actual value of the linearity parameter determined based on the feedback signal, and the gain actuator circuit 332 is configured to generate the actuator output based on the output of the linearity actuator circuit and the deviation from the linear behavior computed by the linearity diagnostic circuit.

Example 16 provides the apparatus according to example 15, where the linearity parameter is an error vector magnitude (EVM).

Example 17 provides the apparatus according to example 15, where the linearity parameter is an adjacent channel leakage ratio (ACLR).

Example 18 provides the apparatus according to example 15, where the linearity parameter is a first linearity parameter, the linearity diagnostic circuit is configured to compute the deviation from the linear behavior further based on a difference between a target value of a second linearity parameter and an actual value of the second linearity parameter, the actual value of the second linearity parameter determined based on the feedback signal, the first linearity parameter is an error vector magnitude (EVM), and the second linearity parameter is an adjacent channel leakage ratio (ACLR).

Example 19 provides the apparatus according to any one of examples 14-18, where ensuring that the deviation from the linear behavior is below the threshold includes ensuring that $(x-y)^2 < \varepsilon_{min}$.

Example 20 provides the apparatus according to any one of examples 14-19, where the deviation from the linear behavior is determined based on at least one of an error vector magnitude, computed for the feedback signal, and an adjacent channel leakage ratio, computed for the feedback signal.

Example 21 provides the apparatus according to any one of examples 14-20, where the output of the power amplifier array is further based on one or more bias signals configured to bias the power amplifier array, and where the one or more bias signals are based on the deviation from the linear behavior.

Example 22 provides the apparatus according to any one of examples 14-21, where each of the actuator input and the actuator output is a complex baseband signal.

Example 23 provides the apparatus according to any one of examples 14-22, where the power amplifier array includes N power amplifiers, where N is an integer equal to or greater than 1, and the vector of complex gains includes N elements, where each of the N elements is a complex gain for a respective one of the N power amplifiers.

Example 24 provides the apparatus according to any one of examples 14-23, where the output of the power amplifier array is based on the actuator output by having one or more drive signals configured to drive the power amplifier array being based on the actuator output.

Example 25 provides an apparatus for controlling linearity of an amplifier, the apparatus including a linearity adjustment circuit 330 and a bias actuator circuit 832. The linearity adjustment circuit is configured to compute a value of a linearity parameter based on a feedback signal (y) indicative of an output (z) of the amplifier (e.g., of a power amplifier of an RF transceiver), and generate a linearity control signal 335 based on a linearity error ($\epsilon$) indicative of a difference between the computed value of the linearity parameter and a target value of the linearity parameter. The bias actuator circuit is configured to generate one or more bias signals for biasing the amplifier when the amplifier generates the output, where the bias signal is based on the linearity control signal.

Example 26 provides the apparatus according to example 25, where the linearity parameter is a first linearity parameter, the linearity adjustment circuit 330 is further configured to compute a value of a second linearity parameter based on the feedback signal, and the linearity error is further indicative of a difference between the computed value of the second linearity parameter and a target value of the second linearity parameter.

Example 27 provides the apparatus according to example 26, where the linearity adjustment circuit 330 is further configured to compute a first error parameter ($\epsilon 1$) based on the difference between the target value ($LP1_{target}$) of the first linearity parameter and the computed value ($LP1_{computed}$) of the first linearity parameter, compute a second error parameter ($\epsilon 2$) based on the difference between the target value ($LP2_{target}$) of the second linearity parameter and the computed value ($LP2_{computed}$) of the second linearity parameter, and generate the linearity error based on the first error parameter and the second error parameter.

Example 28 provides the apparatus according to example 27, where the first error parameter is computed as $\epsilon 1 = 1 - 10^{\wedge}((LP1_{computed} - LP1_{target})/20)$, and the second error parameter is computed as $\epsilon 2 = 1 - 10^{\wedge}((LP2_{computed} - LP2_{target})/20)$.

Example 29 provides the apparatus according to examples 27 or 28, where the linearity error is generated as a value being equal to a minimum of the first error parameter and the second error parameter.

Example 30 provides the apparatus according to any one of examples 26-29, where the first linearity parameter is an error vector magnitude (EVM), and the second linearity parameter is an adjacent channel leakage ratio (ACLR).

Example 31 provides the apparatus according to any one of examples 25-30, where the linearity control signal 335 includes one or more parameters computed as to maximize a power of the output of the power amplifier while ensuring that the linearity error is below a threshold ($\epsilon_{min}$).

Example 32 provides the apparatus according to any one of examples 25-31, further including a digital predistortion (DPD) circuit 320, configured to generate a DPD output (v) based on an input (x) and the feedback signal (y), where the power amplifier is configured to generate the output further based on the DPD output.

Variations and Implementations

While embodiments of the present disclosure were described above with references to exemplary implementations as shown in FIGS. 1-10, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as filters, converters, mixers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to RF transceivers with linearity optimizers, in various communication systems.

Parts of various systems for implementing linearity optimizers as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the RF transceivers with linearity optimizers shown in FIGS. 1-5 and 8-9) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to RF transceivers with linearity optimizers as proposed herein illustrate only some of the possible functions that may be executed by, or within, communication systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. An apparatus for a radio frequency (RF) transceiver, the apparatus comprising:
a digital predistortion (DPD) circuit; and
a linearity adjustment circuit;
wherein:
the DPD circuit is to generate a DPD output (v) based on an input (x) and a feedback signal (y) indicative of an output (z) of a power amplifier of the RF transceiver,
the linearity adjustment circuit is to:
compute a value of a linearity parameter based on the feedback signal, and
generate a linearity control signal based on a linearity error ($\varepsilon$) indicative of a difference between the computed value of the linearity parameter and a target value of the linearity parameter, where the linearity control signal includes one or more parameters to configure a power of the output of the power amplifier to be above a power threshold while ensuring that the linearity error is below a linearity threshold, and
the power amplifier is to generate the output of the power amplifier based on the DPD output and the linearity control signal.

2. The apparatus according to claim 1, wherein:
the linearity parameter is a first linearity parameter,
the linearity adjustment circuit is further to compute a value of a second linearity parameter based on the feedback signal, and
the linearity error is further indicative of a difference between the computed value of the second linearity parameter and a target value of the second linearity parameter.

3. The apparatus according to claim 2, wherein the linearity adjustment circuit is to:
compute a first error parameter based on the difference between the target value of the first linearity parameter and the computed value of the first linearity parameter,
compute a second error parameter based on the difference between the target value of the second linearity parameter and the computed value of the second linearity parameter, and
generate the linearity error based on the first error parameter and the second error parameter.

4. The apparatus according to claim 3, wherein the linearity error is generated as a value being equal to a minimum of the first error parameter and the second error parameter.

5. The apparatus according to claim 1, wherein:
the one or more parameters include one or more gain values,
the linearity adjustment circuit is to apply the one or more gain values to the DPD output (v) to generate an adjusted DPD output (u), and
the power amplifier is to generate the output of the power amplifier based on the DPD output and the linearity control signal by generating the output of the power amplifier based on the adjusted DPD output.

6. The apparatus according to claim 5, wherein the one or more gain values are included in a vector of complex gains generated by the linearity adjustment circuit.

7. The apparatus according to claim 5, wherein the linearity adjustment circuit is to increase the one or more gain values when the linearity error indicates that a linearity of the output of the power amplifier satisfies one or more criteria for the output of the power amplifier to be considered linear, and wherein the linearity adjustment circuit is to decrease the one or more gain values when the linearity error indicates that the linearity of the output of the power amplifier fails to satisfy the one or more criteria for the output of the power amplifier to be considered linear.

8. The apparatus according to claim 7, wherein:
the linearity adjustment circuit is to increase the one or more gain values up to a predefined maximum gain value, and/or
the linearity adjustment circuit is to decrease the one or more gain values down to a predefined minimum gain value.

9. The apparatus according to claim 1, wherein:
the one or more parameters include one or more bias values,
the linearity adjustment circuit is to apply the one or more bias values to a bias signal to bias the power amplifier to generate an adjusted bias signal to bias the power amplifier, and
the power amplifier is to generate the output of the power amplifier based on the DPD output and the linearity control signal by generating the output of the power amplifier by being driven with a signal based on the DPD output and by being biased with the adjusted bias signal.

10. The apparatus according to claim 1, wherein the linearity control including the one or more parameters to configure the power of the output of the power amplifier to be above the power threshold while ensuring that the linearity error is below the linearity threshold includes the linearity control signal including the one or more parameters to maximize the power of the output of the power amplifier while ensuring that the linearity error is below the linearity threshold.

11. An apparatus for use in a radio frequency (RF) transceiver, the apparatus comprising:
an actuator for a power amplifier array of the RF transceiver, the actuator to receive an actuator input (x) and generate an actuator output (u); and
a linearity adaptation circuit, to determine a vector of complex gains based on a feedback signal (y) indicative of an output of the power amplifier array,
wherein:
the output of the power amplifier array is based on the actuator output,
the actuator is to generate the actuator output based on the actuator input and the vector of complex gains, and
the linearity adaptation circuit is to determine the vector of complex gains in a manner that maximizes a power of the actuator output while ensuring that a deviation from a linear behavior, determined based on the actuator input and the feedback signal, is below a threshold.

12. The apparatus according to claim 11, wherein:
the actuator includes a linearity actuator circuit and a gain actuator circuit,
the linearity adaptation circuit includes a DPD adaptation circuit and a linearity diagnostic circuit,
the DPD adaptation circuit is to compute one or more DPD adaptation parameters based on the feedback signal,
the linearity actuator circuit is to generate an output based on the actuator input and the one or more DPD adaptation parameters computed by the DPD adaptation circuit,
the linearity diagnostic circuit is to compute the deviation from the linear behavior based on a difference ($\varepsilon$) between a target value of a linearity parameter and an actual value of the linearity parameter, the actual value of the linearity parameter determined based on the feedback signal, and
the gain actuator circuit is to generate the actuator output based on the output of the linearity actuator circuit and the deviation from the linear behavior computed by the linearity diagnostic circuit.

13. The apparatus according to claim 12, wherein:
the linearity parameter is a first linearity parameter,
the linearity diagnostic circuit is to compute the deviation from the linear behavior further based on a difference between a target value of a second linearity parameter and an actual value of the second linearity parameter, the actual value of the second linearity parameter determined based on the feedback signal,
the first linearity parameter is an error vector magnitude (EVM), and
the second linearity parameter is an adjacent channel leakage ratio (ACLR).

14. The apparatus according to claim 11, wherein ensuring that the deviation from the linear behavior is below the threshold includes ensuring that $(x-y)^2$ is smaller than the threshold.

15. The apparatus according to claim 11, wherein the output of the power amplifier array is further based on one or more bias signals to bias the power amplifier array, and wherein the one or more bias signals are based on the deviation from the linear behavior.

16. The apparatus according to claim 11, wherein the power amplifier array includes N power amplifiers, and the vector of complex gains includes N elements, where N is an integer equal to or greater than 1, and where each of the N elements is a complex gain for a respective one of the N power amplifiers.

17. The apparatus according to claim 11, wherein the output of the power amplifier array is based on the actuator output by having one or more drive signals to drive the power amplifier array being based on the actuator output.

18. An apparatus for controlling linearity of an amplifier, the apparatus comprising:
a linearity adjustment circuit, to compute a value of a first linearity parameter and to compute a value of a second linearity parameter based on a feedback signal (y) indicative of an output (z) of the amplifier, and generate a linearity control signal based on a linearity error ($\varepsilon$) indicative of a difference between the computed value of the first linearity parameter and a target value of the first linearity parameter, and further indicative of a difference between the computed value of the second linearity parameter and a target value of the second linearity parameter; and
a bias actuator circuit, to generate one or more bias signals for biasing the amplifier when the amplifier generates the output, where the bias signal is based on the linearity control signal,
wherein the linearity adjustment circuit is further to:
compute a first error parameter ($\varepsilon 1$) based on the difference between the target value ($LP1_{target}$) of the first linearity parameter and the computed value ($LP1_{computed}$) of the first linearity parameter as $\varepsilon 1=1-10^{\wedge}((LP1_{computed}-LP1_{target})/20)$,
compute a second error parameter ($\varepsilon 2$) based on the difference between the target value ($LP2_{target}$) of the second linearity parameter and the computed value ($LP2_{computed}$) of the second linearity parameter as $\varepsilon 2=1-10^{\wedge}((LP2_{computed}-LP2_{target})/20)$, and
generate the linearity error based on the first error parameter and the second error parameter.

19. The apparatus according to claim 18, further comprising a digital predistortion (DPD) circuit, to generate a DPD output (v) based on an input (x) and the feedback signal (y), where the power amplifier is to generate the output further based on the DPD output.

* * * * *